(12) United States Patent
Anbuky et al.

(10) Patent No.: US 6,924,622 B1
(45) Date of Patent: Aug. 2, 2005

(54) BATTERY CAPACITY MEASUREMENT

(75) Inventors: Adnan H. Anbuky, Christchurch (NZ); Phillip E. Pascoe, Christchurch (NZ)

(73) Assignee: Invensys Energy Systems (NZ) Limited, Christchurch (NZ)

( * ) Notice: Subject to any disclaimer, the term of this patent is extended or adjusted under 35 U.S.C. 154(b) by 237 days.

(21) Appl. No.: 09/979,906

(22) PCT Filed: Jun. 2, 2000

(86) PCT No.: PCT/NZ00/00089

§ 371 (c)(1),
(2), (4) Date: Nov. 27, 2001

(87) PCT Pub. No.: WO00/75678

PCT Pub. Date: Dec. 14, 2000

(30) Foreign Application Priority Data

Jun. 3, 1999 (NZ) .............................................. 9912778

(51) Int. Cl.[7] .......................... H02J 7/00; G01N 27/416
(52) U.S. Cl. ....................................... 320/132; 324/427
(58) Field of Search ................................ 320/132, 134, 320/135, 128, 130, 131, 133, 150; 324/426, 427, 435; 706/2, 5, 52, 100

(56) References Cited

U.S. PATENT DOCUMENTS

| | | | |
|---|---|---|---|
| 4,876,513 A | 10/1989 | Brilmyer et al. | 324/427 |
| 4,952,862 A | 8/1990 | Biagetti et al. | 320/132 |
| 5,130,659 A | 7/1992 | Sloan | 324/435 |
| 5,371,682 A | 12/1994 | Levine et al. | 702/63 |
| 5,587,660 A | 12/1996 | Chabbert et al. | 324/426 |
| 5,587,924 A | 12/1996 | Rossi | 702/63 |
| 5,619,417 A | 4/1997 | Kendall | 702/63 |
| 5,663,626 A * | 9/1997 | D'Angelo et al. | 318/799 |
| 5,773,962 A | 6/1998 | Nor | 320/134 |
| 5,786,640 A * | 7/1998 | Sakai et al. | 320/104 |
| 5,822,495 A * | 10/1998 | Wang et al. | 706/2 |
| 5,825,156 A * | 10/1998 | Patillon et al. | 320/134 |
| 6,064,180 A | 5/2000 | Sullivan et al. | 320/132 |
| 6,104,967 A | 8/2000 | Hagen et al. | 700/293 |
| 6,255,801 B1 | 7/2001 | Chalasani | 320/132 |

FOREIGN PATENT DOCUMENTS

| | | |
|---|---|---|
| EP | 0 714 033 | 5/1996 |
| FR | 2 734 061 | 11/1996 |
| WO | WO96/15563 | 5/1996 |
| WO | WO98/32181 | 7/1998 |
| WO | WO98/40951 | 9/1998 |
| WO | WO99/27628 | 6/1999 |
| WO | WO99/34224 | 7/1999 |

OTHER PUBLICATIONS

Konya et al., "A Deterioration Estimating System for 200–Ah Sealed Lead–Acid Batteries," 1994 IEEE, pp. 256–262.

(Continued)

*Primary Examiner*—Pia Tibbits
(74) *Attorney, Agent, or Firm*—Myers Bigel Sibley & Sajovec

(57) ABSTRACT

A method of obtaining information relating to the charge capacity of one or more cells utilizing information from the initial discharge period of the cell or cells. The method involves measuring a variable cell parameter for at least a part of an initial period of discharge during which the cell voltage initially decreases to a through voltage and then increases to a plateau voltage (the Coup De Fouet period), and relating the variable cell parameter to reference information to obtain the absolute or relative charge capacity of the cell or cells. An estimation model for predicting the absolute or relative capacity of a battery includes input for a variable battery parameter and one or more battery operating conditions and/or battery condition, reference information, compensation means determining a correction factor for the variable battery parameter, and calculation means relating corrected variable battery parameter to absolute or relative battery capacity.

64 Claims, 20 Drawing Sheets

Typical Coup De Fouet region of an Oldham 2H1275.

OTHER PUBLICATIONS

Pascoe et al., "Estimation of VRLA Battery Capacity Using The Analysis of The Coup De Fouet Region," 1999 IEEE, 9 pages.

Pascoe et al., "VRLA Battery Capacity Measurement and Discharge Reserve Time Prediction," 1998 IEEE, pp. 302–310.

"IEEE Recommended Practice for Maintenance, Testing, and Replacement of Valve–Regulated Lead–Acid (VRLA) Batteries for Stationary Applications," IEEE Std 1188–1996, 16 pages.

Alber et al., "Impedance Testing—Is it a Substitute for Capacity Testing," INTELEC 1994, 10–1, pp. 245–249.

Anbuky et al., "Knowledge Based VRLA Battery Monitoring and Health Assessment," IEEE, 2000, pp. 687–694.

Cun et al., "The Experience of a UPS Company in Advanced Battery Monitoring," INTELEC 1996, 2 pp. 646–653.

International Search Report, PCT/NZ01/00183, Jul. 23, 2002.

International Search Report, PCT/NZ01/00182, May 29, 2002.

Kurisawa et al., "Capacity Estimating Method of Lead–Acid Battery by Short–time Discharge," INTELEC 1997, pp. 493–490.

Kurisawa et al., "Internal Resistance and Deterioration of VRLA Battery Analysis of Internal Resistance Obtained by Direct Current Measurement and its Application to VRLA Battery Monitoring Technique," INTELEC 1997, 29–3, pp. 687–694.

Markle, Gary J., "AC Impedance Testing for Valve Regulated cell," INTELEC 1992, 9–4, pp. 212–217.

Ng et al., "Evaluation of a Reverese Time Prediction Algorithm for Lead Acid Battery," INTELEC 1996, pp. 616–623.

Suntio et al., "The Batteries as a Principal Component in DC UPS Systems," IEEE, 1990, pp. 400–411.

Supplementary European Search Report, EP 99 94 0753, Jun. 25, 2002.

Troy et al., "Midpoint Conductance Technology Used in Telecommunication Stationary Standby Battery Applications, Part VI, Considerations for Deployment of Midpoint Conductance in Telecommunications Power Applications," INTELEC 1997, 29–4, pp. 695–702.

Yamamoto et al., "Deterioration Estimation Method for 200–Ah Sealed Lead–Acid Batteries," NTT Review, vol. 7, No. 4, Jul. 1995, pp. 65–69.

Yamashita et al., "A New Battery Check System in Telecommunications Power Plants," NTT Review, vol. 9, No. 3, May 1997, pp. 131–135.

* cited by examiner

Typical Coup De Fouet region of an Oldham 2H1275.

New Hawker 2H1275 cell.

After thermal stress.

After thermal stress and the replenishment of water.

Shape of the Coup De Fouet for previous discharges to depth of 1%.

Shape of the Coup De Fouet for previous discharges to depth beyond 1% (illustrating the double dip phenomenon).

Shape of the Coup De Fouet for previous discharges to depth of 12.5%.

Shape of the Coup De Fouet for previous discharges to depth of 100%.

The Coup De Fouet region for consecutive discharges of cell after various charge durations.

The detail of trough region of Figure 3a.

The trough voltage parameter versus charge time for consecutive discharges of cell after various charge durations.

The plateau voltage parameter versus charge time for consecutive discharges of cell after various charge durations.

Consecutive discharges after fixed periods of charging at float voltages of 2.22, 2.27, 2.32V.

The relation between the float voltage and the trough and plateau voltages.

Discharge voltage profiles of six cells discharged at different rates.

Close-up of Coup De Fouet region of Figure 5a.

Discharge voltage profiles of six cells discharged at different ambient temperatures.

Close-up of Coup De Fouet region of Figure 6a.

The relation between capacity and the trough voltage parameter due to the use of different discharge rates.

The relation between capacity and the plateau voltage parameter due to the use of different discharge rates.

The relation between capacity and the trough voltage parameter due to the use of different ambient temperatures.

The relation between capacity and the plateau voltage parameter due to the use of different ambient temperatures.

Discharge voltage profiles from accelerated ageing test.

Detail of Coup De Fouet region of Figure 9a.

The trough voltages versus capacity.

The plateau voltages versus capacity.

Discharge voltage profiles for water replenished cells.

Detail of Coup De Fouet region of Figure 10a.

The trough voltage versus capacity.

The plateau voltage versus capacity.

Training results.

Validation results.

| Cell (periods of ageing) | Original | Post-age | Water replenished |
|---|---|---|---|
| | Capacity (% of rated capacity) | | |
| 0 periods #1 | 104 | 121 | 120 |
| 0 periods #2 | 103 | 123 | 120 |
| 2 periods #1 | 105 | 102 | 116 |
| 2 periods #2 | 106 | 109 | 119 |
| 3 periods #1 | 105 | 64 | 118 |
| 3 periods #2 | 105 | 64 | 111 |
| 4 periods #1 | 106 | 21 | 107 |
| 4 periods #2 | 105 | 10 | 97 |
| 5 periods #1 | 104 | 45 | 116 |
| 5 periods #2 | 104 | 30 | 106 |

Original, post thermal ageing and post water replenished capacities.
TABLE 1

| Cell (periods of ageing) | Pre-age weight | Post-age weight | Weight difference |
|---|---|---|---|
| | (grams) | | |
| 0 periods #1 | 18688 | 18689.5 | -1.5 |
| 0 periods #2 | 18614.5 | 18616.5 | -2 |
| 2 periods #1 | 18794 | 18646.5 | 147.5 |
| 2 periods #2 | 18848.5 | 18687.5 | 161 |
| 3 periods #1 | 18881 | 18644 | 237 |
| 3 periods #2 | 18806 | 18577.5 | 228.5 |
| 4 periods #1 | 18844.5 | 18554 | 290.5 |
| 4 periods #2 | 18838 | 18544.5 | 293.5 |
| 5 periods #1 | 18747.5 | 18554.5 | 193 |
| 5 periods #2 | 18677.5 | 18501 | 176.5 |

Cell pre- and post-age weights and weight differences.
TABLE 2

BATTERY CAPACITY MEASUREMENT

CROSS-REFERENCE TO RELATED APPLICATIONS

The present application is a U.S. national phase application of PCT International Application No. PCT/NZ00/00089, having an international filing date of Jun. 2, 2000 and claiming priority to New Zealand Application No. 9912778-9, filed Jun. 3, 1999, the disclosures of which are incorporated herein by reference in their entirety. The above PCT International Application was published in the English language as International Publication No. WO 00/75678.

FIELD OF THE INVENTION

The invention relates to a method of obtaining information relating to the charge capacity of a battery. It relates in particular, although not exclusively, to a method of obtaining information relating to the charge capacity of a battery which is in a fully charged condition, without the need to fully discharge the battery.

BACKGROUND TO THE INVENTION

Existing battery capacity measurement approaches suffer one or more of the following disadvantages:
1. Being off line approaches, so that continuity of monitoring is interrupted.
2. Requiring full discharge that leaves other equipment vulnerable and exposed to shutdown.
3. Requiring sophisticated and expensive testing equipment.
4. Requiring manual operation for performing the measurement.
5. Requiring special AC/DC converter rectification noise level similar to that available with UPS's.
6. Inaccuracy.

In consequence the existing battery capacity measurement techniques are either not acceptable to the telecommunications community because they leave a system vulnerable to failure, demand high cost, impose long delays between testing, require manual measurement procedure, or are not allowed due to telecommunications standards (as is the case with rectification noise levels).

A full discharge test into a stable load is recommended by industry and professional institutions as the only reliable approach for battery capacity measurement and is often referred to as the "capacity test". This approach, however, suffers from substantial disadvantages including the requirement of bulky external loads, the need for backup power supplies, and the labour required to set up and supervise the procedure.

Lately impedance/conductance techniques have become popular for obtaining estimates of battery capacity. These techniques require the use of specialised equipment. In addition there is some uncertainty surrounding their effectiveness with most of the researchers dealing with these techniques being reluctant to promote them as a replacement to the "capacity test".

Due to the dependence of battery capacity on the operating parameters of temperature and discharge rate the accuracy of other existing techniques is not acceptable. Accumulation type techniques depend on an estimation of charging efficiency and require correction factors for different discharge temperatures and rates. In addition they are not tolerant to disruptions to their short term data history.

Curve fitting and parametric models are two other common approaches which also suffer from the requirement of correction factors for different discharge temperature and rates. Curve fitting models try to match the discharge voltage versus time curve to either an exponential parabolic or hyperbolic curve. Some models employ more complex hybrid approaches. The major disadvantage with these models is that for each combination of discharge conditions and battery type a parameter set is required. These parameter sets are obtained through an exhaustive series of discharge tests. Parametric models are based on internal battery parameters such as internal resistance. Models such as this estimate SOC (state of charge) or reserve time by redrawing the manufacturers discharge voltage time curves based on the change in internal resistance. Battery resistance, however, is not always supplied by the manufacturer and therefore must be measured.

The present invention seeks to provide a method by which at least some of the aforedescribed disadvantages are mitigated or overcome. It seeks to provide a method which at the least provides information concerning the capacity of one battery relative to that of another battery, and/or the capacity as influenced by the operating conditions and optionally additionally or alternatively information concerning the absolute or intrinsic charge capacity of a battery.

SUMMARY OF THE INVENTION

In its broadest aspect the invention provides a method of obtaining information relating to the charge capacity of one or more cells including: measuring a variable cell parameter, or change in a variable cell parameter, for at least a part of an initial period of discharge during which the cell voltage initially decreases to a trough voltage and then increases to a plateau voltage; and relating the variable cell parameter, or change in the variable cell parameter, to reference information to obtain the absolute or relative charge capacity of the cell or cells.

In a more particular aspect the invention provides a method of estimating the capacity of a battery including: acquiring reference information relating a variable battery parameter, or change in a variable battery parameter, to one or more a operating conditions and/or battery condition; measuring the variable battery parameter, or change in the variable battery parameter, during at least part of an initial discharge period of the battery, during which the voltage initially decreases to a trough voltage and then increases to a plateau voltage; and relating the variable battery parameter, or change in variable battery parameter, to reference information to obtain an absolute or relative capacity of the battery.

Both electrodes contribute to the cell(s) voltage decrease to a trough voltage and then increase to a plateau voltage. The variable cell parameter may be measured with respect to a single electrode.

The invention envisages that preferably, but not exclusively, measurements are made of cell or electrode voltage, or change of voltage with time, for at least a part of the period of time during which the battery voltage initially decreases to a trough voltage and then increases to a plateau voltage. Typically, the initial period during which the battery output voltage initially decreases to a trough voltage and then increases to a plateau voltage is the Coup De Fouet period.

Preferably, the reference information is the relationship between one or more battery operating conditions and/or battery condition and the trough voltage or plateau voltage of the Coup De Fouet period. The operating conditions may be one or more of time on charge and/or depth of previous charge and/or float voltage and/or ambient temperature and/or discharge rate. Preferably the reference information is acquired when the battery is in the early stages of its operational life.

Preferably before discharge the battery is in a substantially fully charged condition.

Measurement of the variable battery parameter may occur when the battery is subjected an initial period of discharge (a discharge test) or when the battery begins to discharge when required to supply a load. Thus, when a battery begins to discharge into a load the discharge time remaining may be calculated. Alternatively, to determine remaining operational life of the battery it may be subjected to a discharge test.

The method may include use of discrimination means which compares a change of a measured or monitored variable parameter with a change which is compatible with that which occurs in the Coup De Fouet period of initial discharge and responds to whether or not that compatibility is present. Thus, typically the method of the invention comprises a search for the occurrence of the trough or plateau voltage, and measurement of that trough and/or plateau voltage from which capacity is determined using a parameterised relationship.

The invention is intended particularly for measurement of the capacity, or relative capacity, of a battery of a kind in which electrical discharge results in a chemical reaction that produces reaction discharge products. Such batteries typically exhibit the Coup De Fouet characteristic during initial discharge from a fully charged condition, with the voltage initially reducing to a trough voltage and then increasing to a plateau voltage from which it then decreases progressively as the battery is discharged. In particular this invention may be utilised in respect of electrochemical batteries where at least one of the electroactive components is in the liquid phase and therefore under diffusion control, such as a lead/acid battery where the sulphuric acid takes part in the discharge and recharge reactions. The invention may be applied to lead/acid type batteries and other batteries which are re-chargeable.

However, use of the invention to measure the charge of batteries of a non-rechargeable type is not excluded.

The period of discharge necessary to establish information related to battery charge capacity by the method of the present invention is substantially less than the time taken for full discharge, and the loss of charge for the purpose of charge determination also is substantially less. A short discharge test of not more than 10% of nominal capacity in discharge depth is found to be sufficient to reveal information related to the absolute or relative charge capacity of the battery. A discharge of not more than 5% and more preferably not more than 1% of nominal capacity may be employed.

The invention envisages that preferably, but not exclusively, the function of one or more of the above steps is performed by a computer.

The invention further provides for an estimation model for predicting the absolute or relative capacity of a battery, including: input for a variable battery parameter, and one or more battery operating conditions and/or battery condition; reference information relating variable battery parameter to one or more battery operating conditions and/or battery condition; compensation means determining correction factor for variable battery parameter depending on value any one of battery operating conditions and/or battery condition; and calculation means relating corrected variable battery parameter to reference information to obtain the absolute or relative charge capacity of the battery.

The method may include use of training or learning means adapted to determine reference information relating a variable battery parameter to one or more battery operating conditions and/or battery condition; or to determine rules relating variable battery parameter, or change in variable battery parameter, to one or more battery operating conditions and/or battery condition. Preferably, training or learning means may be any one of an Adaptive Neural Fuzzy Interface System or an Adaptive Network, or other Neuro-Fuzzy or Soft Computing system.

The estimation model may be in the form of computer readable code.

There is also provided an apparatus adapted to provide information relating to the charge capacity of a battery, including: measurement means adapted to measure a variable battery parameter, or change in variable battery parameter; and processing means adapted to relate the variable battery parameter, or change in variable battery parameter, to reference information to obtain the absolute or relative charge capacity of the battery.

Preferably, but not exclusively, the apparatus may measure voltage, or change of voltage, for at least part of an initial period of discharge of a battery during which the battery voltage initially decreases to a trough voltage and then increases to a plateau voltage; and may also measure one or more battery operating conditions.

Preferably, the apparatus includes a microprocessor adapted to manipulate a variable battery parameter, or change in variable battery parameter, and one or more battery operating conditions and/or battery condition and output an estimation of the absolute or relative charge capacity of the battery. The microprocessor may be adapted to output the discharge time remaining expressed in hours and fractions of two an hour, and/or be adapted to output the remaining operational life of the battery. The output means may be graphical, numerical or otherwise.

Preferably, but not exclusively, the apparatus may further include a discharge means, the discharge means adapted to at least partially discharge a battery and measure the variable battery parameter, or change in variable battery parameter, for at least part of the partial discharge.

The apparatus may also include training or learning means adapted to determine rules relating a variable battery parameter, or change in a variable battery parameter, to one or more battery operating conditions and/or battery condition.

Further aspects of the invention will become apparent from the following description which is given by way of example only.

BRIEF DESCRIPTION OF THE DRAWINGS

The invention will now be described by way of example and with reference to the attached drawings in which.

TABLE 1: Shows data for the original and post ageing capacity of cells; and

TABLE 2: Shows data for the original and post ageing weight of cells.

DESCRIPTION OF THE PREFERRED EXAMPLES

Examples of tests undertaken in accordance with and to verify the present invention will now be described.

The Coup De Fouet is an electrochemical phenomenon. The invention is intended particularly for measurement of the capacity, or relative capacity, of a battery of a kind in which electrical discharge results in a chemical reaction that produces reaction discharge products. Such batteries typically exhibit the Coup De Fouet characteristic during initial discharge from a fully charged condition, with the voltage initially reducing to a trough voltage and then increasing to a plateau voltage from which it then decreases progressively as the battery is discharged. In particular this invention may be utilised in respect of electrochemical batteries where at least one of the electroactive components is in the liquid phase and therefore under diffusion control, such as a lead/acid battery where the sulphuric acid takes part in the discharge and recharge reactions. The invention may be applied to lead/acid type batteries and other batteries which are re-chargeable.

Figure 1A:
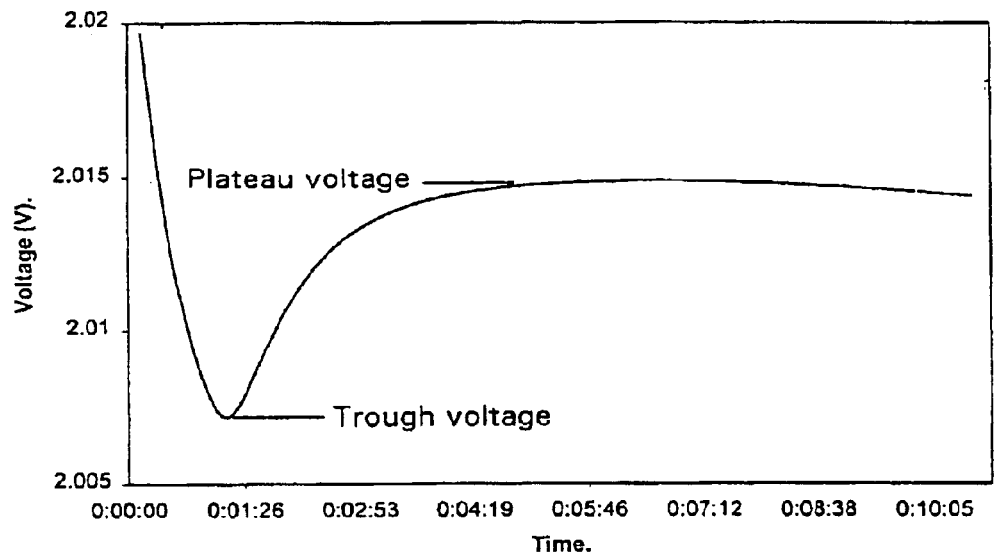
FIGS. 1a–1d: illustrates the Coup De Fouet region during cell discharge.

The voltage vs. time (hours:minutes:seconds:tenths of second) characteristic for the Coup De Fouet period of discharge of typical commercially available battery, the single cell Oldham type 2HI 275, is shown in FIG. 1a. During initial discharge from a fully charged condition the voltage drops quickly to a trough voltage and then increases to a peak, plateau voltage within about 4 to 5 minutes from initial discharge. The voltage then gradually reduces as the cell discharges.

Figure 1B:
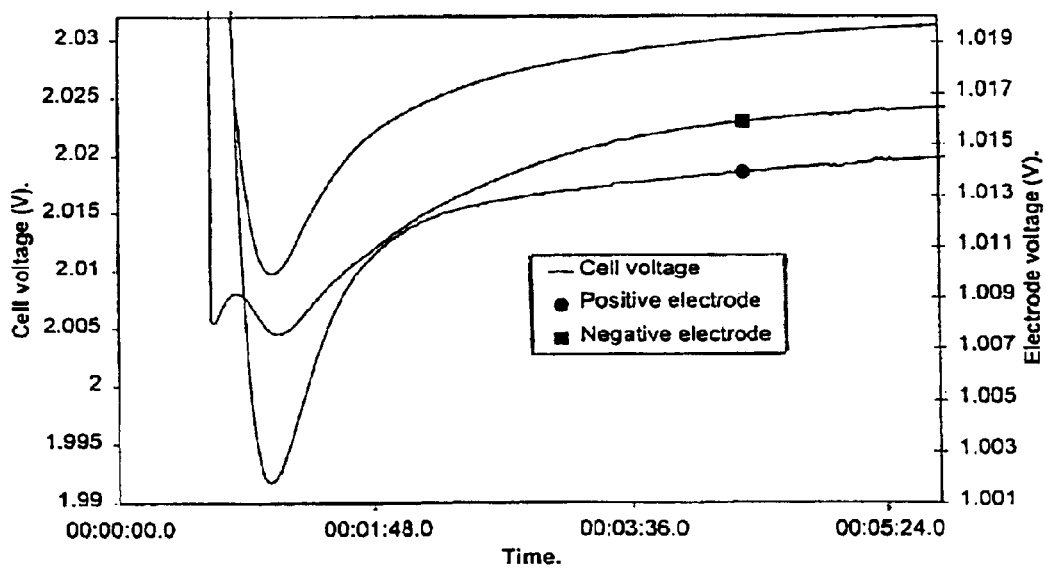
Figure 1C:
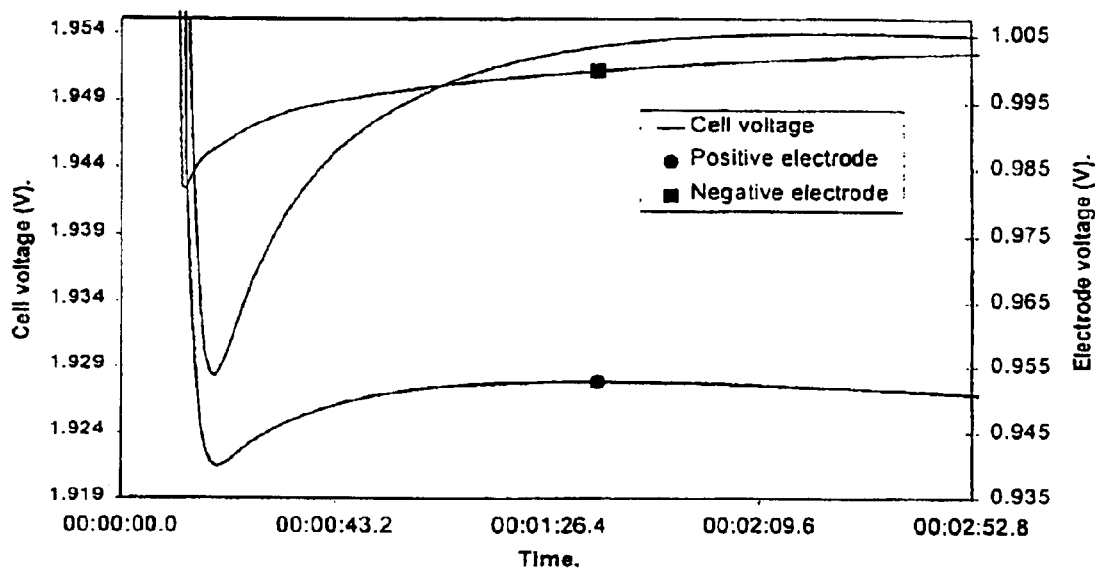
Figure 1D:
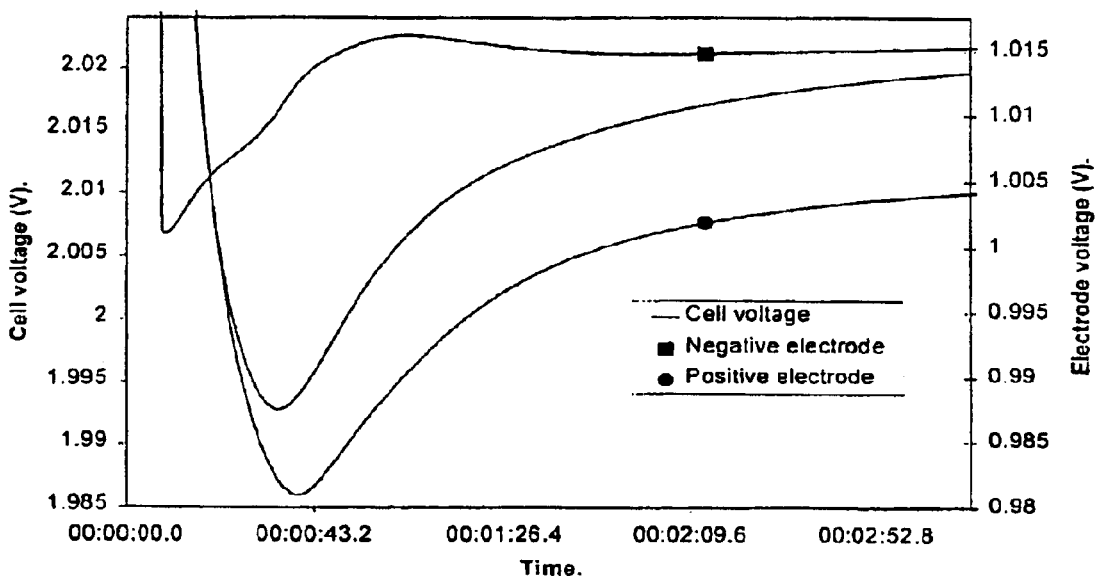

Tests conducted using a mercurous-sulphate reference electrode have determined that both electrodes contribute to the Coup De Fouet. There is a significant contribution made by the negative electrode. Three situations are illustrated in FIGS. 1b to 1d. In all cases the negative electrode appears as dominant as the positive electrode. Thus, the Coup De Fouet may be measured at one battery electrode with respect to a reference point.

The invention identifies that the level of the trough and plateau voltages during the Coup De Fouet period are influenced by the operating conditions and condition of the battery. Typical operating conditions which effect the Coup De Fouet are depth of previous discharge, time on float charge, float voltage, ambient temperature and discharge rate. The effect that each of these conditions has on Coup De Fouet is discussed in turn.

Figure 2A:
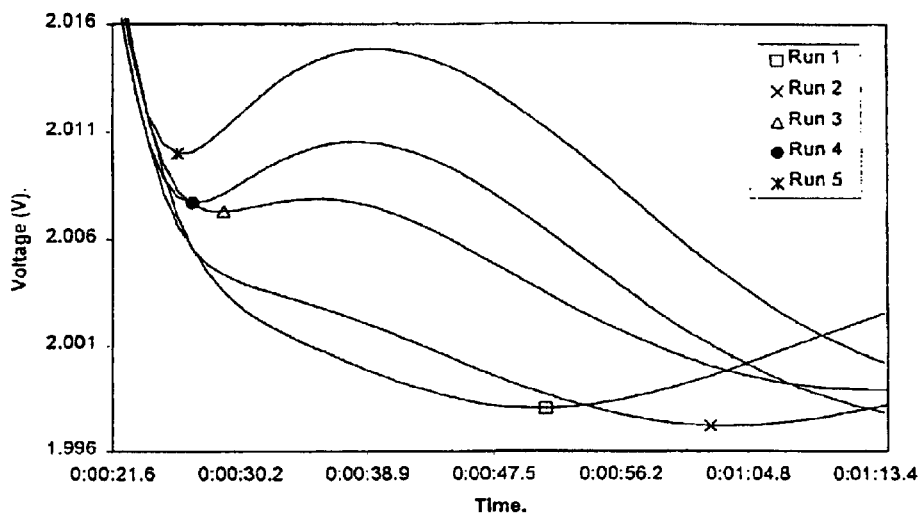
FIGS. 2a–2d: illustrates the shape of the Coup De Fouet for previous discharges to various depths.
Figure 2B:
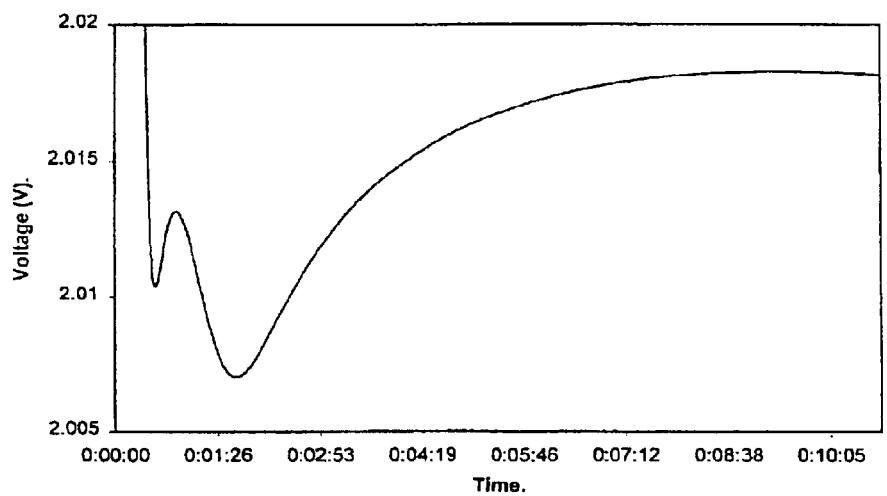
Figure 2C:
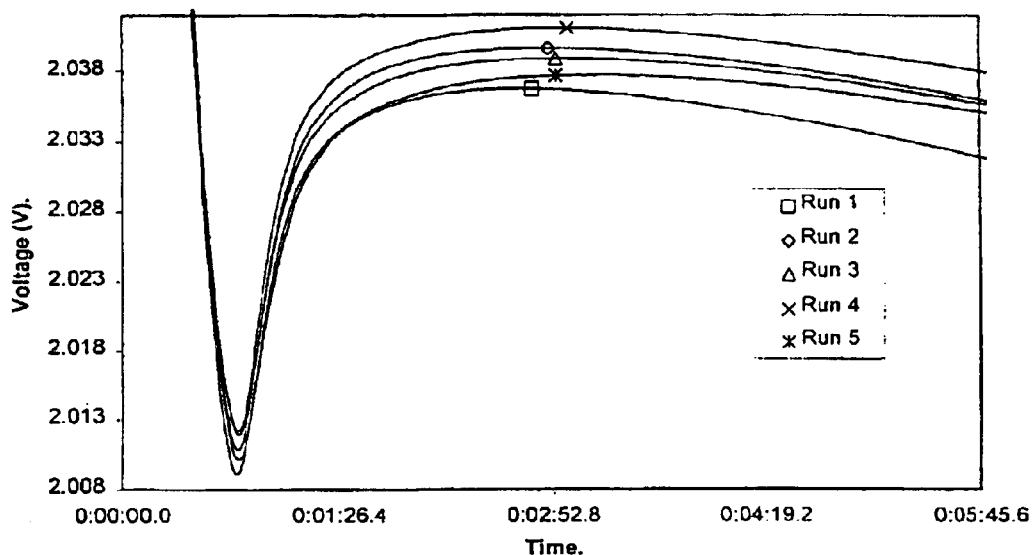
Figure 2D:
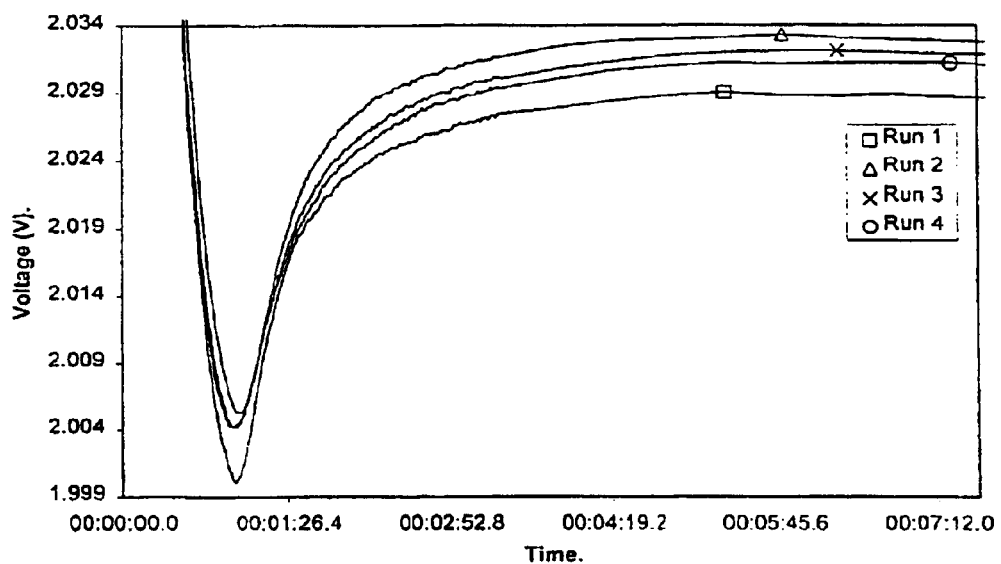

The depth of the previous discharge has an influence on the shape of the Coup De Fouet. FIGS. 2a to 2d illustrate consecutive discharges of an Oldham 2HI275 cell to various depths. The discharge rate was 100 A and the ambient temperature was 20° C. After each discharge 110% of the charge released during the discharge was supplied to the cell and then it was charged for a further 24 hours. Under these operating conditions the cell is rated to release 177 Ah of charge when discharged to a depth of 1.85V. FIG. 2a illustrates discharges to a depth of 1% (~1.8 Ah). Here the first discharge is normal with the voltage decreasing to the trough before recovering. The next discharge also decreased to the trough, however, the shape of the voltage profile has altered, being much flatter prior to the trough. The following discharges clearly show the establishment of what appears to be a second dip. This is evident in FIG. 2b where the discharge is allowed to continue past the 1% depth. A similar affect is observed for discharges up to a depth of approximately 12%. For discharge to a depth of greater than 12%, as illustrated in FIG. 2c and 2d where the discharge depth is 12.5% and 100% respectively, the Coup De Fouet of consecutive discharges are very consistent.

Figure 3A:
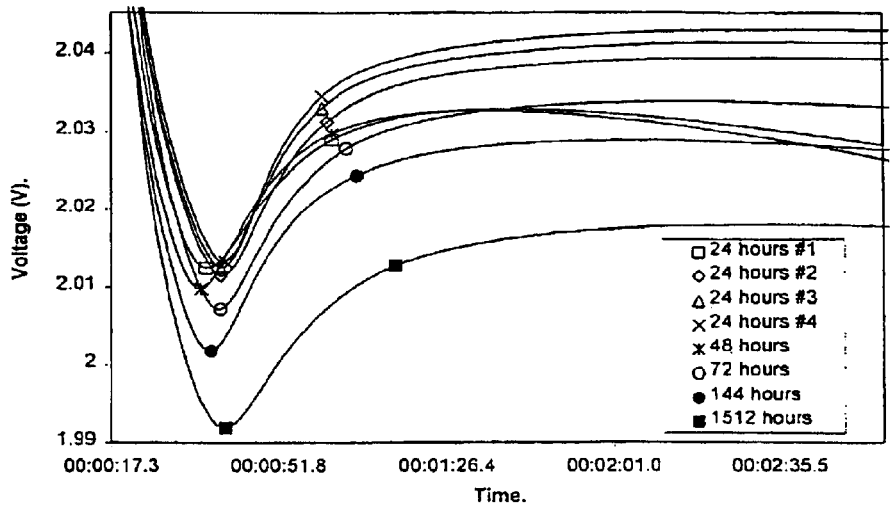
FIGS. 3a–3d: illustrates the dependence of the Coup De Fouet on the time on charge.
Figure 3B:
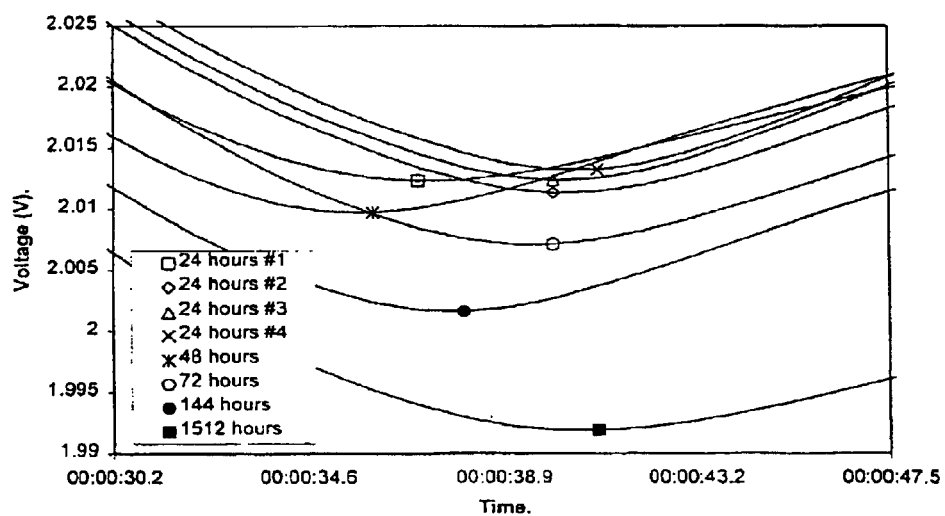
Figure 3C:
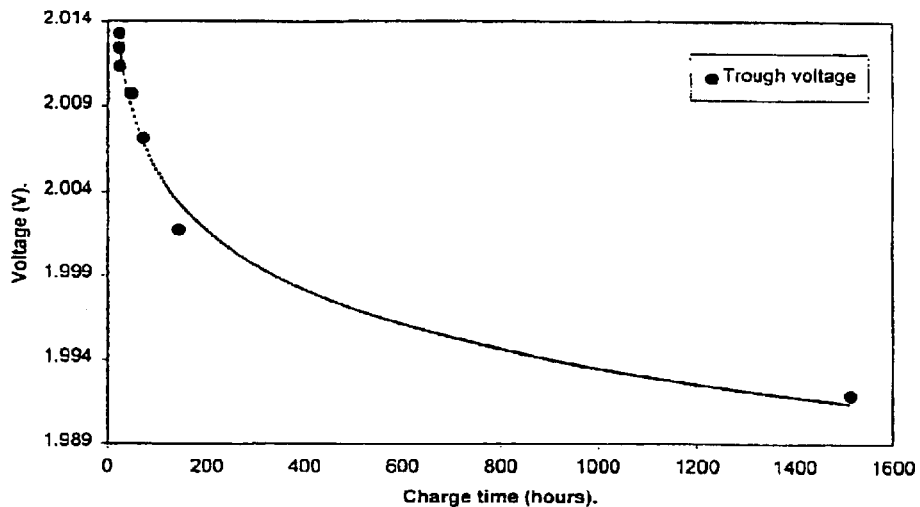
Figure 3D:
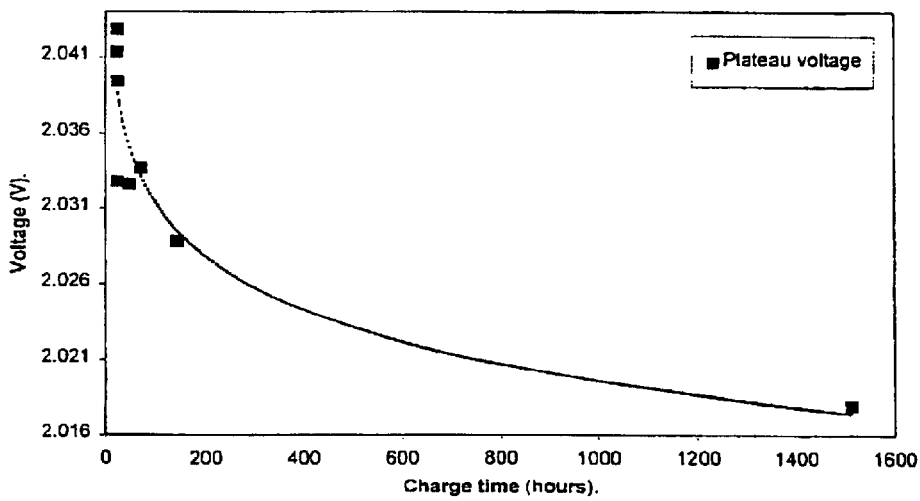

FIGS. 3a to 3d illustrate the dependence of the Coup De Fouet on the time on charge. FIG. 3a illustrates the Coup De Fouet region of consecutive discharges to a depth of 12.5% of an Oldham 2HI275 cell at a rate of 100 A and ambient temperature of 20° C. FIG. 3b illustrates the trough region in greater detail. It is apparent that the longer the cell is charged, the deeper the trough voltage is. This is clear from FIGS. 3c and 3d where the trough and plateau voltages are plotted against charge time respectively.

Figure 4A:
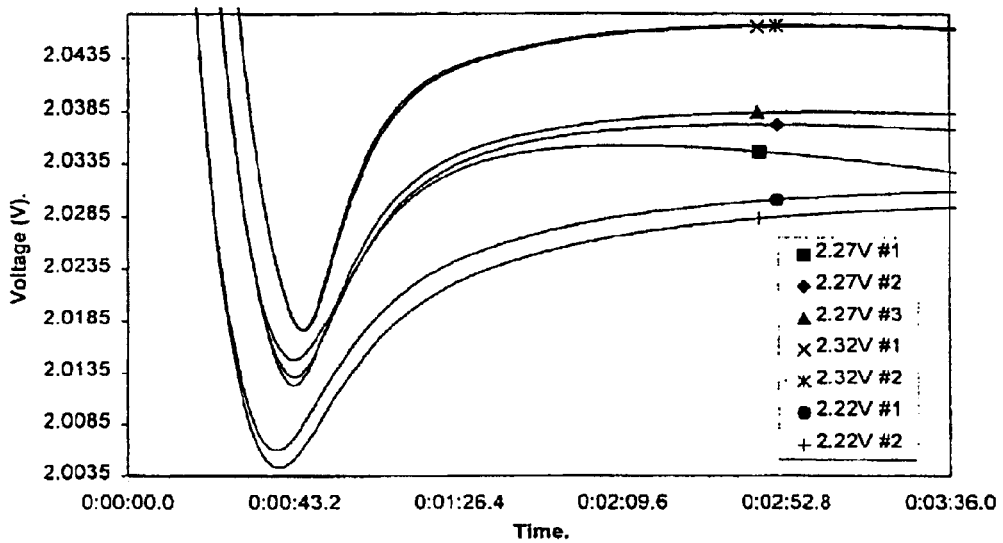
FIGS. 4a–4b: illustrates the influence of float voltage on Coup De Fouet.
Figure 4B:
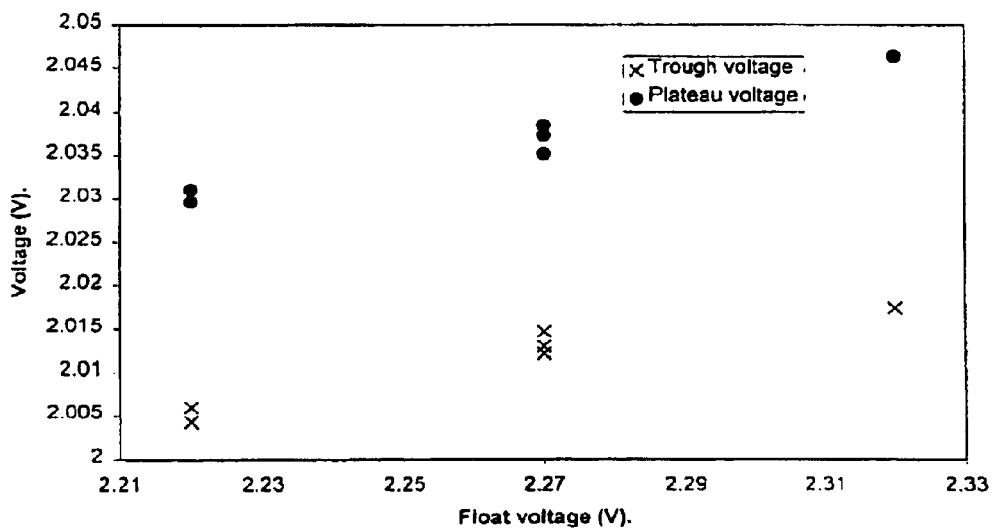

Due to the series connection of multiple cells it is not easy to maintain a uniform float voltage on each cell without the use of additional hardware known as equalisers. Equalisers are not common thus it is necessary to determine the influence of variations in float voltage. FIG. 4a illustrates consecutive discharges of an Oldham cell to a depth of 12.5% at a rate of 100 A and ambient temperature of 20° C. Between each discharge the cell was recharge for a fixed period of 30 hours utilising float voltages of 2.22, 2.27 and 2.32V. The nominal float voltage for the operating conditions is 2.27V. FIG. 4b illustrates the relation between the float voltage and the trough and plateau voltages. It is apparent that the lower the float voltage the lower the trough and plateau voltages.

Tests were conducted to establish the relationship between capacity and Coup De Fouet for different combinations of discharge rate and ambient temperature. The battery when configured as a 12 volt string and discharged at 100 amps over a period of about 2 hours. The discharge profiles of those cells during the initial Coup De Fouet period are summarised below.

Figure 5A:
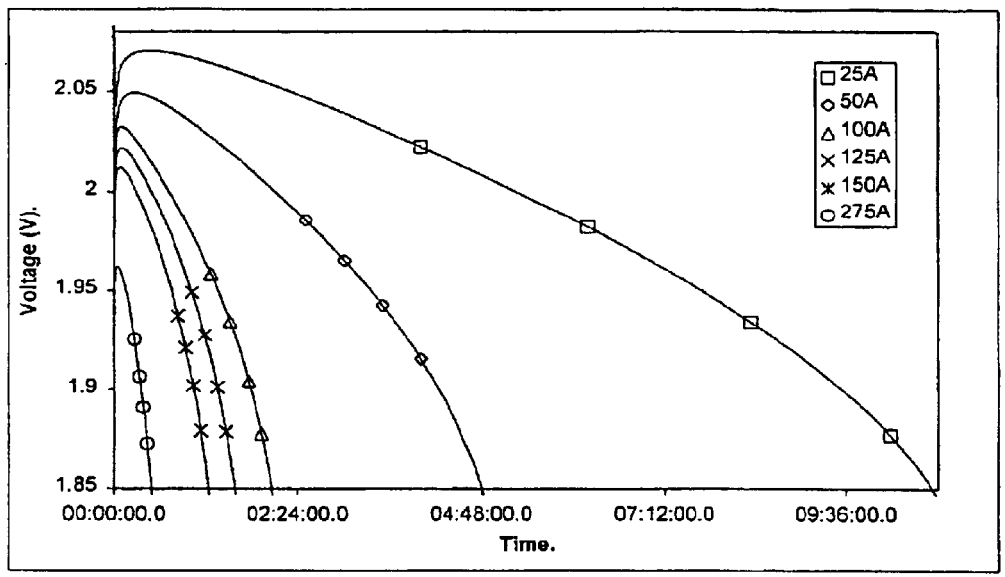
FIGS. 5a–5b: illustrates the shape of the Coup De Fouet for various discharge rates.
Figure 5B:
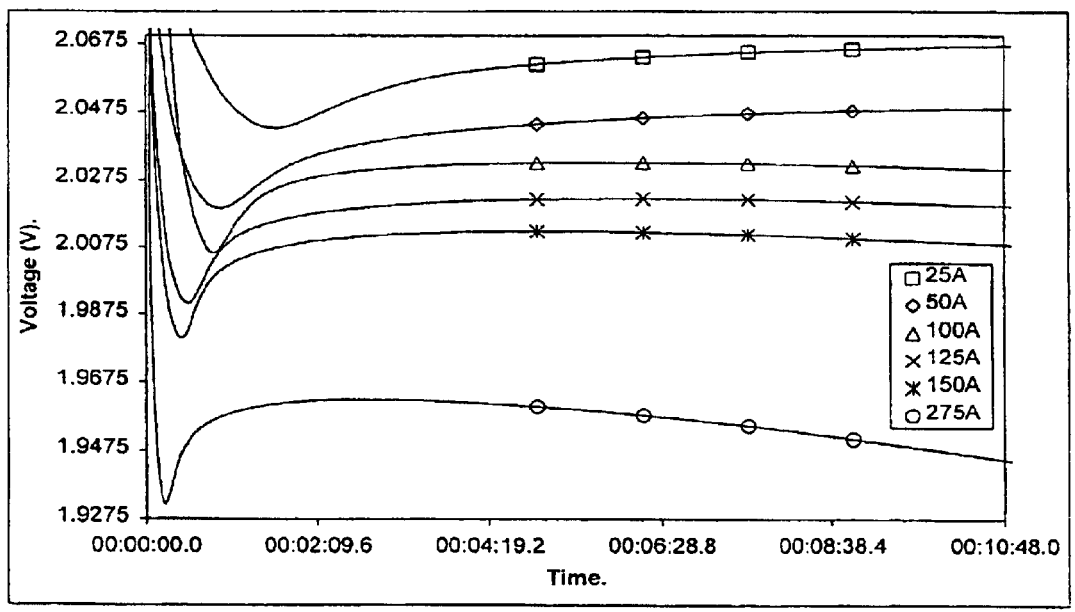

Results of substantially full discharges obtained for six different discharge currents are shown in FIG. 5a. The results for the Coup De Fouet period are shown in more detail by FIG. 5b.

Figure 6A:
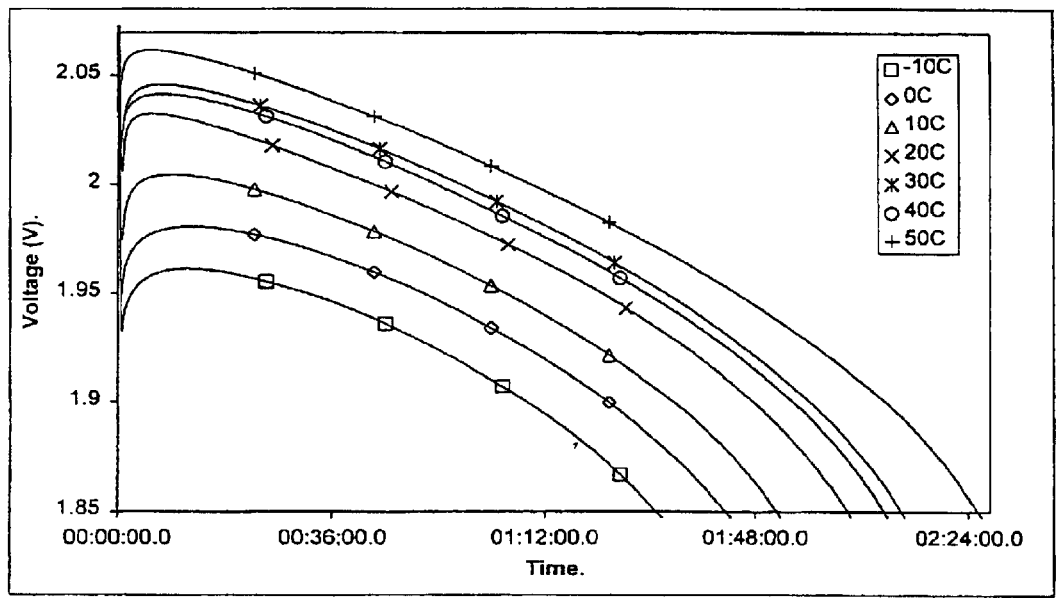
FIGS. 6a–6b: illustrates the shape of the Coup De Fouet for various ambient temperatures.
Figure 6B:
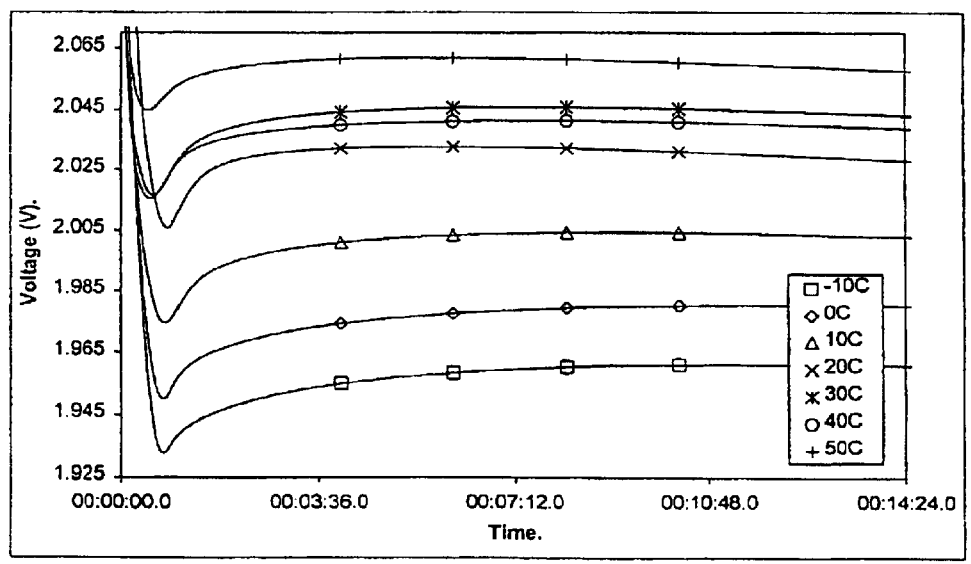

FIG. 6a shows seven discharge voltages vs. time profiles for the cells when being discharged at different ambient temperatures. The results for the Coup De Fouet period are shown in more detail by FIG. 6b.

Figure 7A:
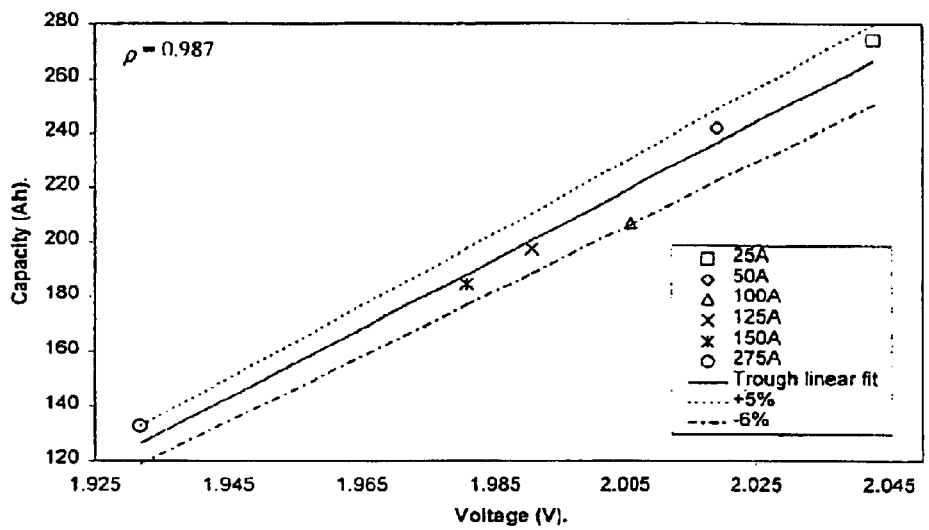
FIGS. 7a–7b: illustrates the relation between Coup De Fouet and capacity for different discharge rates.
Figure 7B:
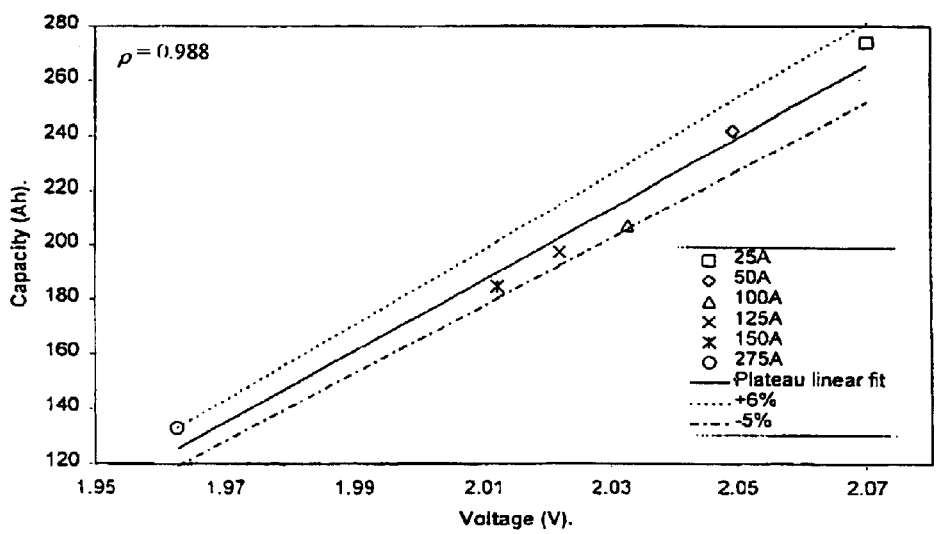
Figure 8A:
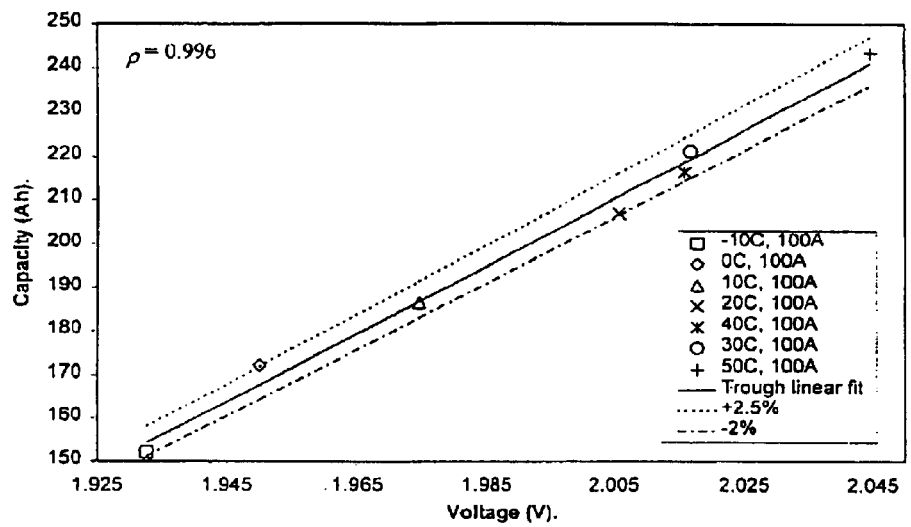
FIGS. 8a–8b: illustrates the relation between Coup De Fouet and capacity for different ambient temperatures.
Figure 8B:
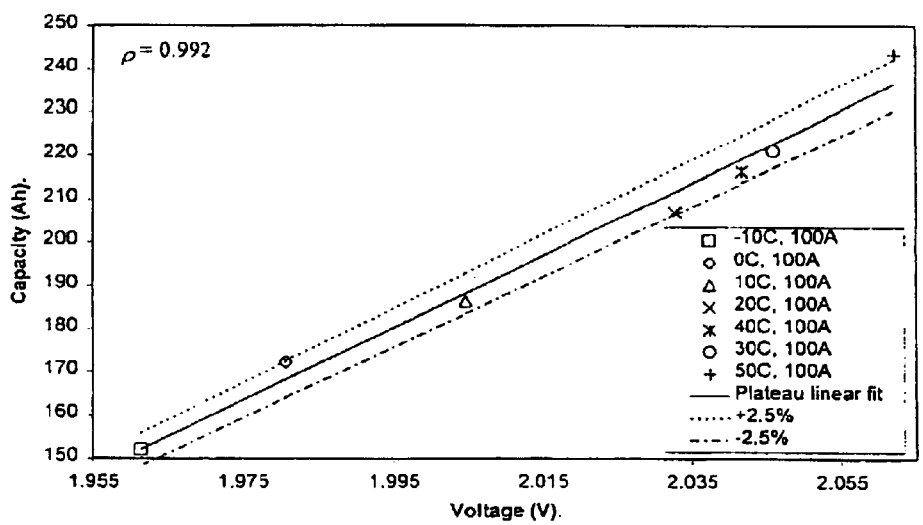

The key results from these tests are shown in FIGS. 7a and 7b and FIGS. 8a and 8b. FIGS. 7a and 7b illustrate the relation between capacity due to the use of various discharge rates and the trough and plateau voltage parameters respectively. FIGS. 8a and 8b illustrate the relation between capacity due to the use of various ambient temperatures and the trough and plateau voltage parameters respectively. For both operating conditions and for both parameters (the trough and plateau voltage) the relations are close to linear. This examination of the voltage of the battery during the Coup De Fouet period may be used to conveniently provide information related to the battery capacity.

Determining the capacity due to operating conditions is helpful if prompt time remaining information is required at the start of a discharge. The ultimate aim, however, is to determine the capacity due to the condition of the battery alone and not the operating conditions. In order to facilitate this goal the effects of battery condition on the Coup De Fouet must be determined. Investigations were undertaken to determine the influence of battery condition on the Coup De Fouet due to two modes of battery degradation. The first mode is accelerated thermal ageing. The second mode is the result of replenishing the water lost from the cells which had undergone the accelerated thermal ageing.

Accelerated ageing is commonly used to rate a battery's operational life. The experiment was conducted by charging four pairs of Oldham 2HI275 cells at the nominal 20° C. float voltage of 2.27V, and ambient temperature of 71° C., for from 2 to 5 periods. Each period consisted of 13 days. A further pair of cells were charged under standard conditions (2.27V, 20° C. ambient temperature). As a result, after discharging at a rate of 100 A to an end voltage of 1.85V, the cells exhibited capacities of between 10% and 123% of manufacturers rated capacity (177 Ah).

The original and post ageing capacities are given in Table 1. The original capacity is given as a percentage related to the ten hour discharge to an end voltage of 1.75V. The important point to note is the consistency of the cells original capacity and the variation in the cells capacity after ageing.

The cells were weighed prior to undergoing the accelerated ageing. After the accelerated ageing they were re-weighed with the resulting difference in weight giving an indication in the amount of water lost during the process. The pre and post ageing weights along with the weight differences are given in Table 2.

Figure 9A:
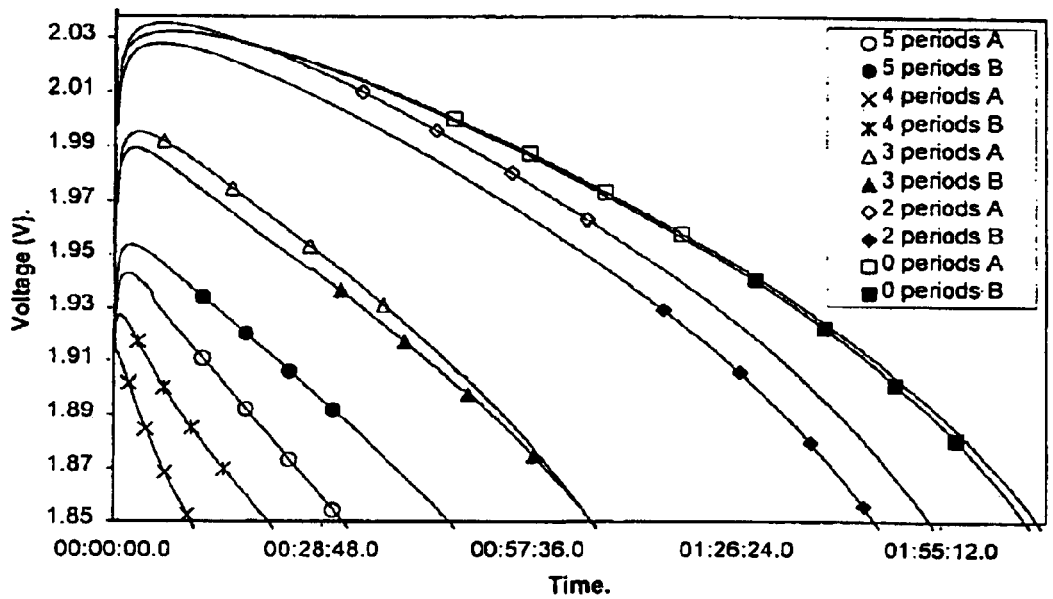
FIGS. 9a–9d: illustrates the influence of accelerated thermal ageing on Coup De Fouet.
Figure 9B:
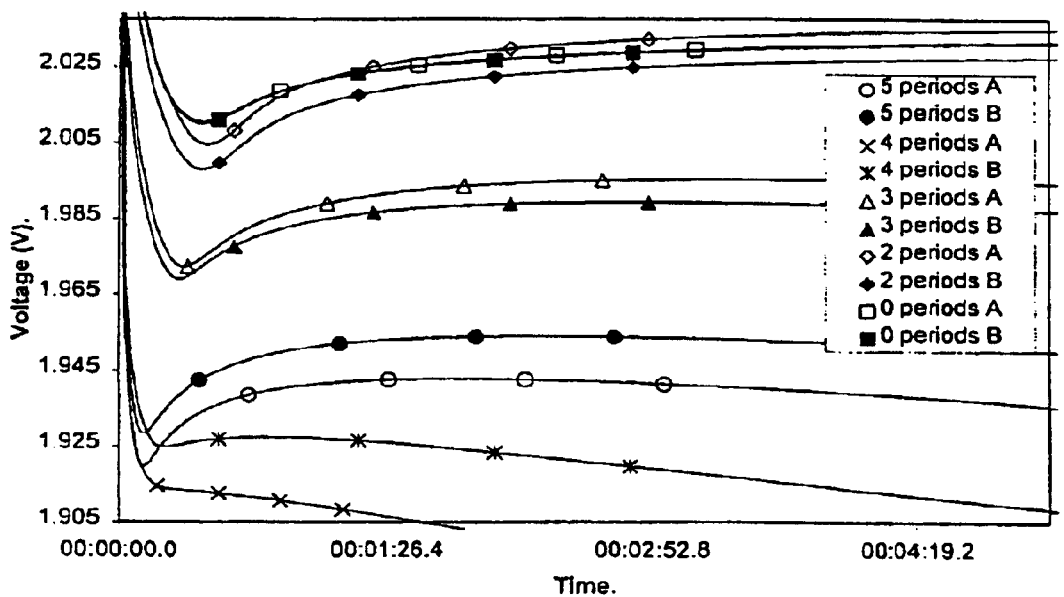
Figure 9C:
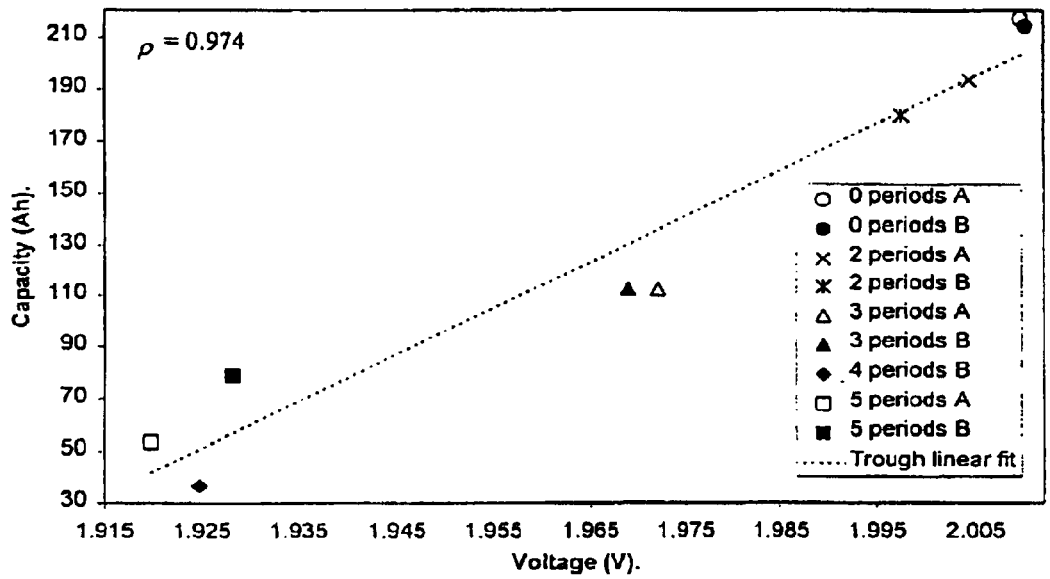
Figure 9D:
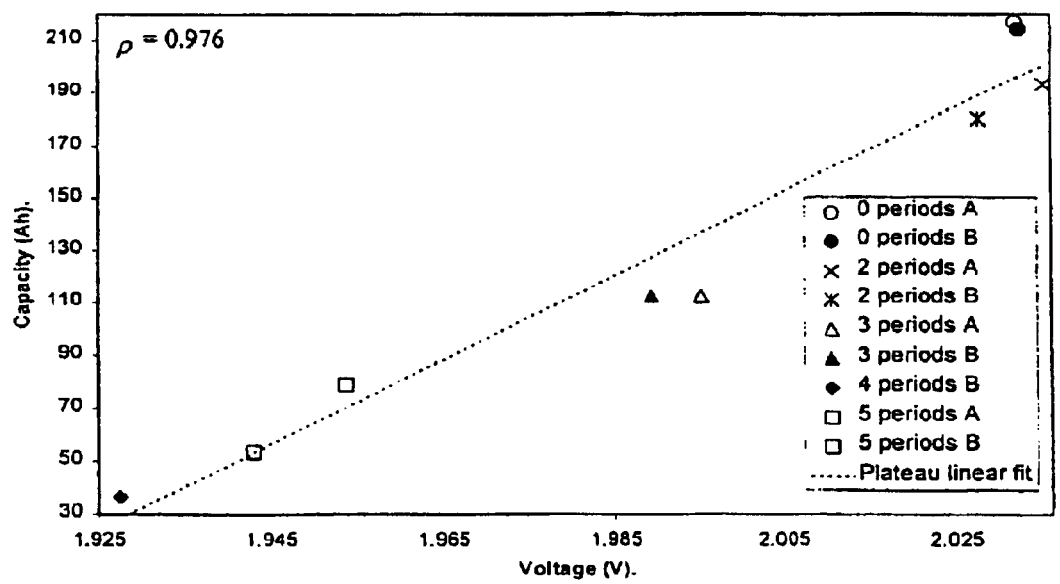

FIGS. 9a to 9d illustrate the effect of accelerated thermal ageing on the Coup De Fouet. FIG. 9a illustrates the entire discharge voltage profiles of each pair of cells and FIG. 9b illustrates a close up of the Coup De Fouet region of the discharges. Clearly the cells which have the lowest capacity have a lower Coup De Fouet (trough and plateau voltages). The relation between the capacity due to the degradation in battery condition with the trough and plateau voltages is illustrated in FIGS. 9c and 9d respectively. It can be seen here that in both cases the relation is close to linear.

Figure 10A:
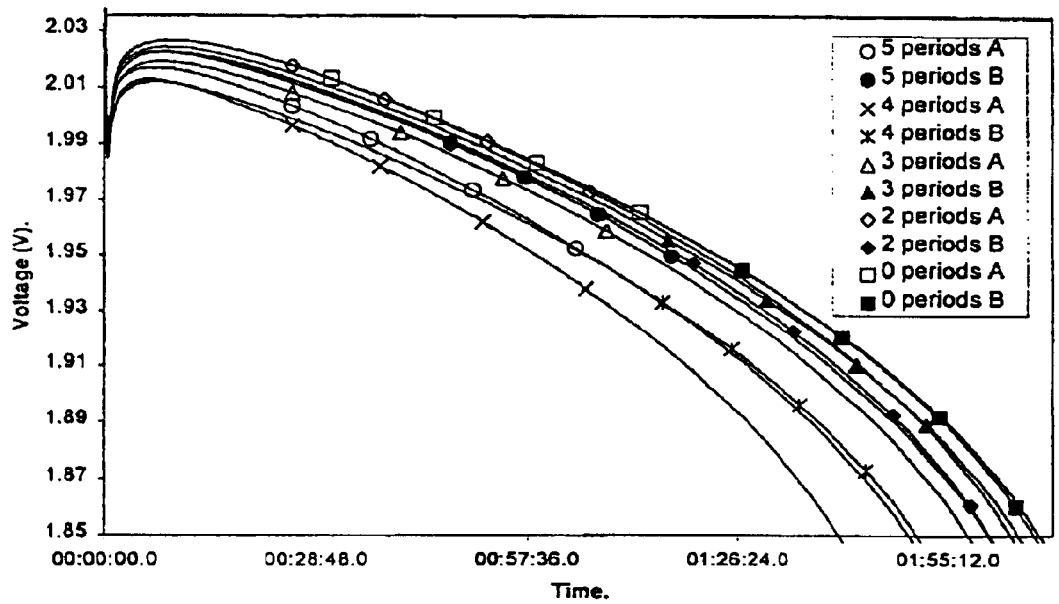
FIGS. 10a–10d: illustrates the influence of accelerated thermally and water replenishment on Coup De Fouet.
Figure 10B:
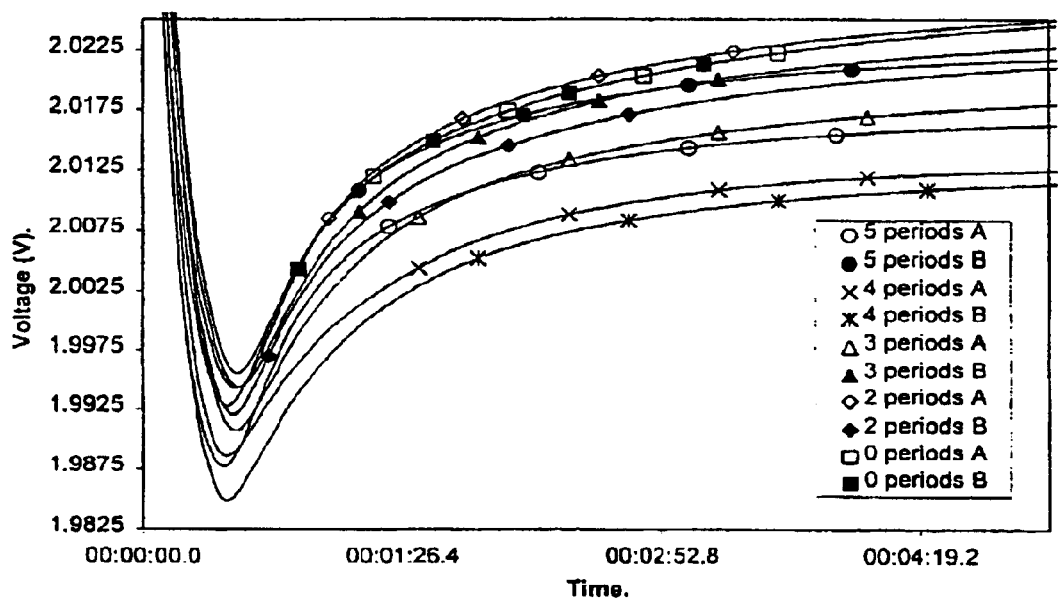

Using the information of Table 2 it was possible to replenish the water lost through the thermal ageing process. The cells were then re-charged and discharged. As a result of the addition of water much of the cells capacity was recovered, to be between 97 and 120% of rated capacity. The post water replenished capacities are given in Table 1. FIGS. 10a to 10d illustrate the influence of water replenishment on Coup De Fouet. The improvement in capacity is clear from inspection of the discharge voltage profiles given in FIG. 10a. FIG. 10b illustrates a close up of the Coup De Fouet region reflecting a much greater consistency between the cells.

Figure 10C:
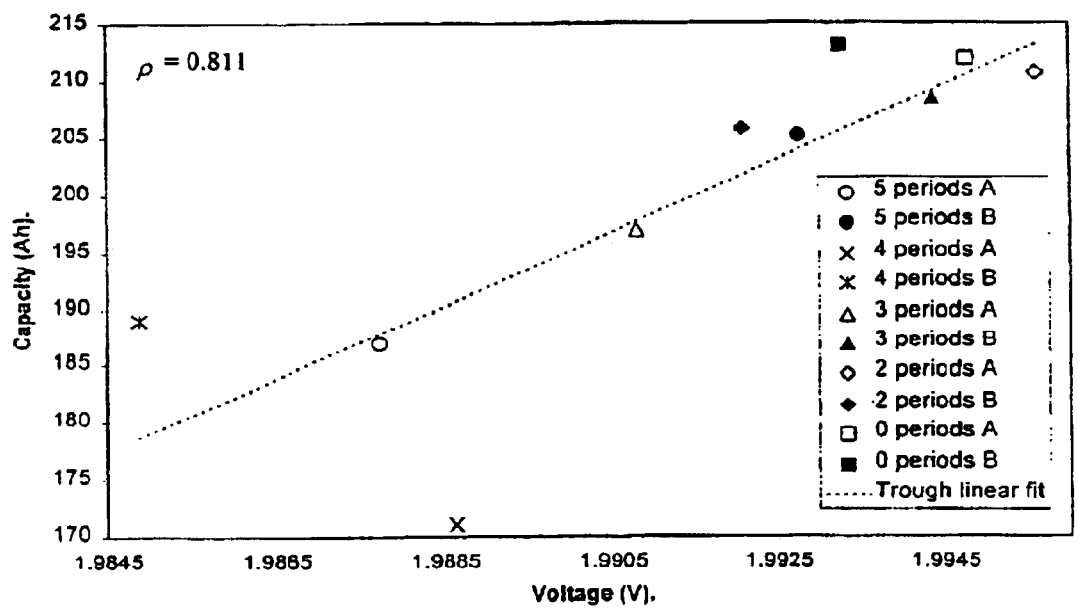
Figure 10D:
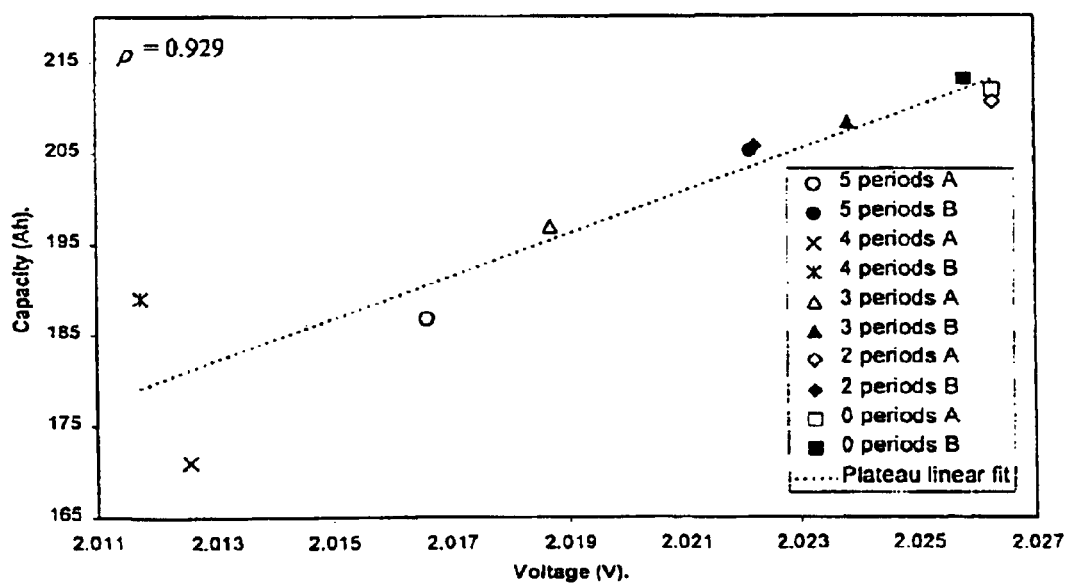

The relation between the capacity and the trough and plateau voltages is illustrated in FIGS. 10c and 10d respectively. It can be seen here that in both cases the relation is still close to linear, although not as consistent as the relations illustrated in FIGS. 9c and 9d.

Details presented above show a relation between operating conditions battery condition and the Coup De Fouet. Not all of the operating conditions have a corresponding affect on capacity (at least in the short term). If, however, the Coup De Fouet is to be employed in a capacity estimation scheme then the effect of all operating conditions on the Coup De Fouet must be eliminated. Thus any resulting variation in the Coup De Fouet will be solely attributed to variations in battery condition.

The above results show that the relations between operating conditions and the Coup De Fouet parameters are not random. In isolation simple equations can be derived to express these relations. However, in combination the relations become more complex. It is not, however, practical to exhaustively test every combination of operating and battery condition. In light of this the results presented above suggest a strong case for employing soft computing to formulate a capacity estimation model.

The knowledge gathered by conducting the above tests represents a baseline for the rules of this model. The following paragraphs present the structure of the model and the result of its application. The following discussion will consider only the trough voltage. The trough is targeted as it occurs close to the start of discharge. Thus, a discharge to the trough will result in minimal impact on the power system and battery life. It is also easy to detect due to the sudden voltage reversal. However, the discussion may be applied equally to the plateau voltage.

Figure 11:
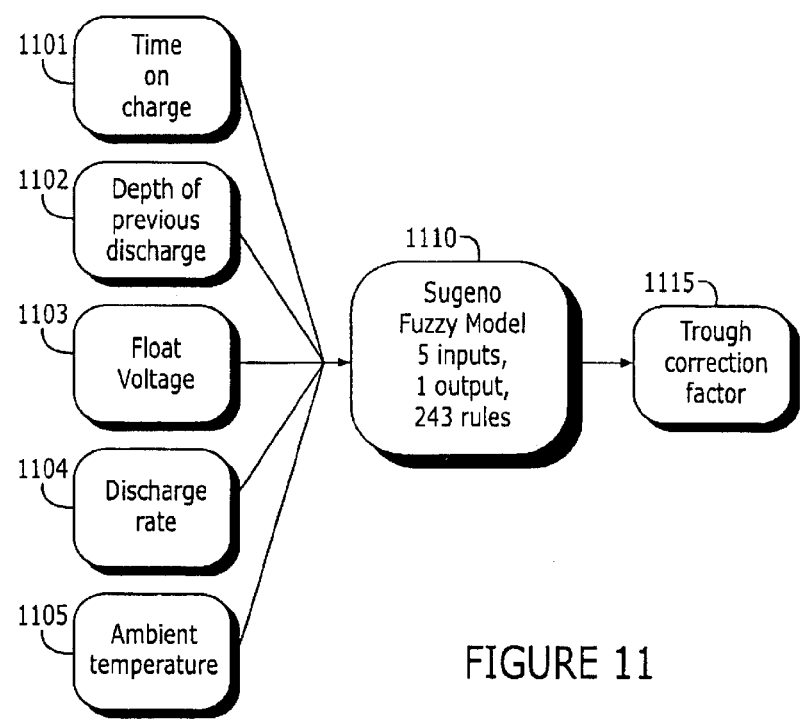
FIG. 11: illustrates a fuzzy logic correction model employed for capacity estimation.

The knowledge of the relations between operating conditions and the trough voltage are contained within a fuzzy logic model. Such models are within the capabilities of the skilled addressee with one particular model, the Sugeno Fuzzy Model, being discussed by T. Takag and M. Sugeno in "Fuzzy Identification Systems and its Application to modeling and control", IEEE Trans, Systa, Man Cybern, Vol. 15, pp. 116–132, 1985; the contents of which is considered included in this specification as if it were individually set forth. The Sugeno Fuzzy Model 1110 is illustrated in FIG. 11. The fuzzy model 1110 has as inputs the operating conditions of time on charge 1101, float voltage 1103, depth of previous discharge 1102, discharge rate 1104 and ambient temperature 1105. Each input utilizes three membership functions.

The output of the model is a correction factor 1115 which also utilizes three membership functions. This correction factor 1115 is applied to the Coup De Fouet parameters associated with the operating conditions to cancel their effect.

To establish the rules and define the membership functions the fuzzy model was trained. In order to expedite this process an Adaptive Neural Fuzzy Inference System (ANFIS) was employed. Such systems are discussed in "Neuro-Fuzzy and Soft Computing, A Computational Approach to Learning and Machine Intelligence", J.-S. R. Jang, C.-T. Sun, and E. Mizutani, Prentice Hall, N.J., USA, 1997; and J. S. R Jang, "ANFIS: Adaptive-Network-Based Fuzzy Inference System," IEEE Trans. Syst., Man Cybern., Vol. 23, pp.665–685, 1993. The contents of both these documents are considered included in this specification as if they were individually set forth. The fuzzy logic Matlab™ toolbox supports this technique. Once the structure (number and type of membership functions) is selected the rules are automatically created and the membership functions are tuned using neural networks.

Figure 12:
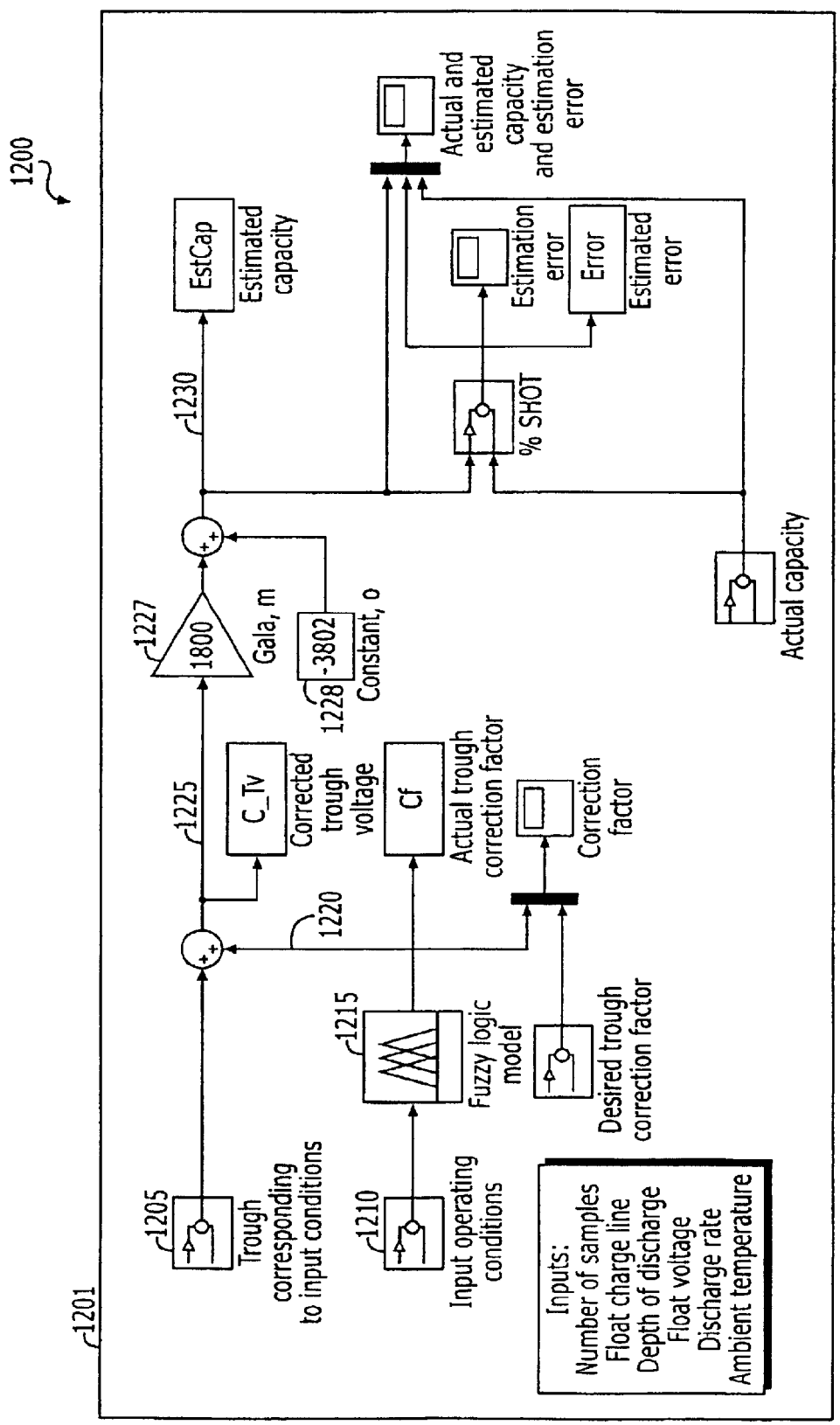
FIG. 12: illustrates a Coup De Fouet capacity estimation model.

The overall structure of the estimation model is illustrated in FIG. 12. The model is implemented using MatLab's Simulink on a computer 1201 (e.g., a microprocessor). The inputs 1210 are fed into the fuzzy model 1215 which produces a correction factor 1220. This correction factor 1220 is added to the trough voltage 1205 corresponding to the inputs 1210 to eliminate the influence of the operating conditions. A simple linear relation (a gain 1227 and an addivitve constant 1228) is used to scale the trough voltage 1225 to determine the capacity 1230. This summation and scaling activity is the hard computing aspect of the model. However, it is envisaged that soft computing techniques could also be used to replace this hard computing aspect.

Figure 13A:
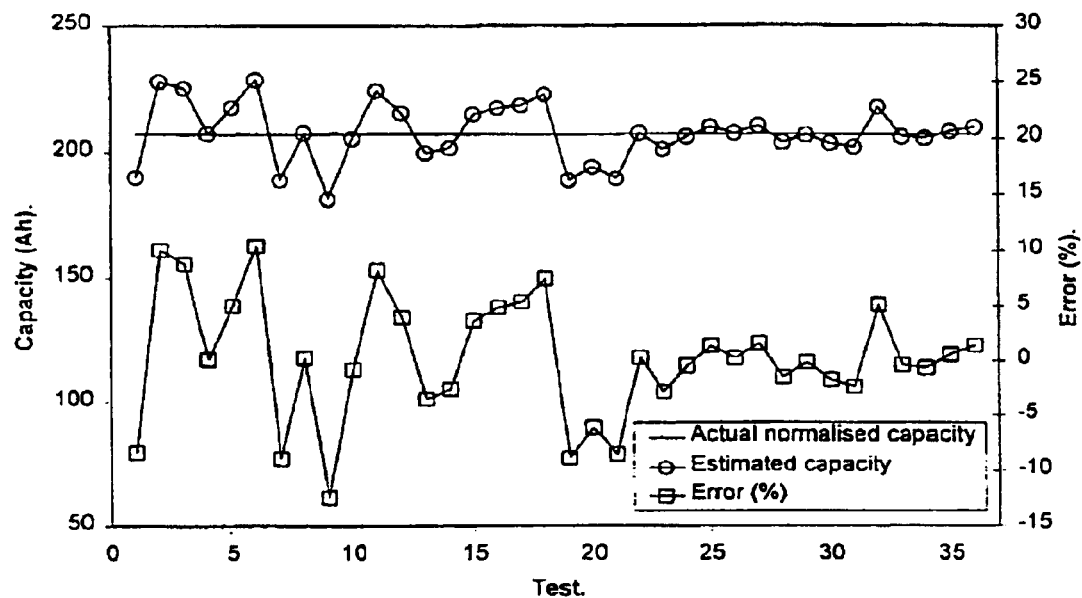
FIGS. 13a–13b: illustrates the results of the capacity estimation model.

Perhaps the most critical aspect of the model is its training. This should be done in the early stages of battery life while incurring minimal impact on the power system. The model of FIG. 11 was trained using data obtained from tests where different operating conditions were used. These tests include those presented above. The capacity of the cells was normalised to that obtained when the cell was discharged at a rate of 100 A and temperature of 20° C. This was determined to be 207 Ah. The training of the linear scaling relation was performed by inspection, but as noted above could be implemented by soft computing techniques. The results of the training can be seen in FIG. 13a. In the main the training error is less than plus or minus 10%.

Figure 13B:
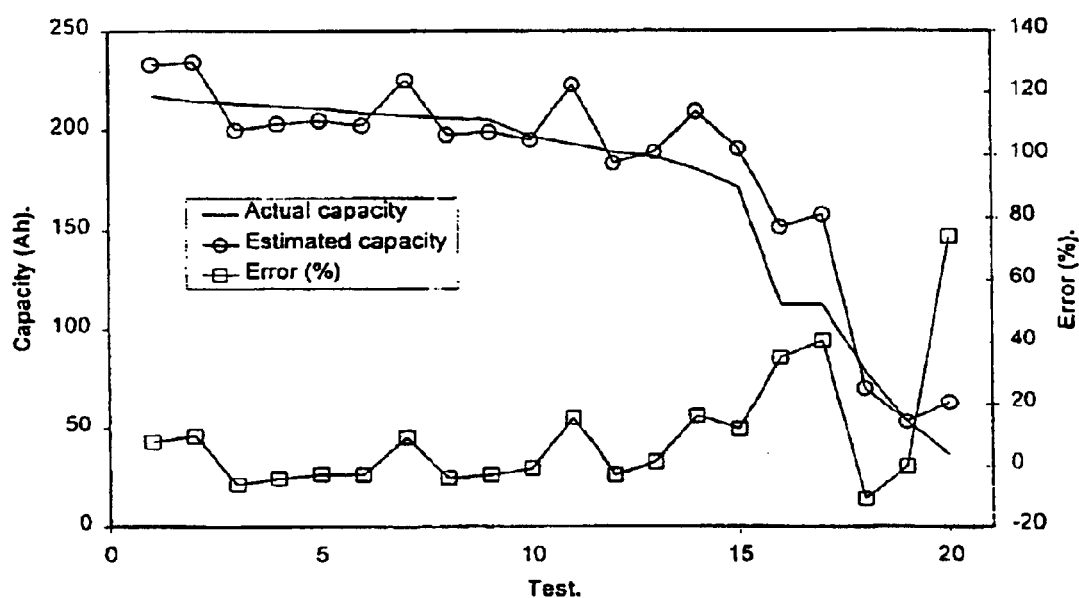

Validation of the model was performed using the data obtained above concerning the influence of battery condition. The results can be seen in FIG. 13b. For cells with very low capacity the error is quite large. This, however, is not as bad as it seems. The cells used have deteriorated to such an extent that even with such a large capacity estimation error the estimation is still informative of a deterioration in capacity. For cells with high to moderately low capacity the estimation is, in the main, between plus or minus 10%.

The period of discharge necessary to establish information related to battery charge capacity by the method of the present invention is substantially less than the time taken for full discharge, and the loss of charge for the purpose of charge determination also is substantially less. A short discharge test of not more than 10% of nominal capacity in discharge depth is found to be sufficient to reveal information related to the absolute or relative charge capacity of the battery. A discharge of not more than 5% and more preferably not more than 1% of nominal capacity may be employed. Thus, utilisation of the Coup De Fouet provides a reliable procedure for charge capacity measurement without any requirement for deep discharge or fast sampling rate. It thus avoids many of the disadvantages inherent in conventional procedures.

Where in the foregoing description reference has been made to integers or elements having known equivalents, then such equivalents are herein included as if individually set forth.

Particular examples of the invention have been described and it is envisaged that improvements and modifications can take place without departing from the scope of the appended claims. Thus, even though the results of the model presented are encouraging, its structure may change. The soft-computing component may be in another form such as a pattern recognition based model. Soft computing may also be employed to derive the scaling parameters used in the hard computing component of the model.

Figure 14:
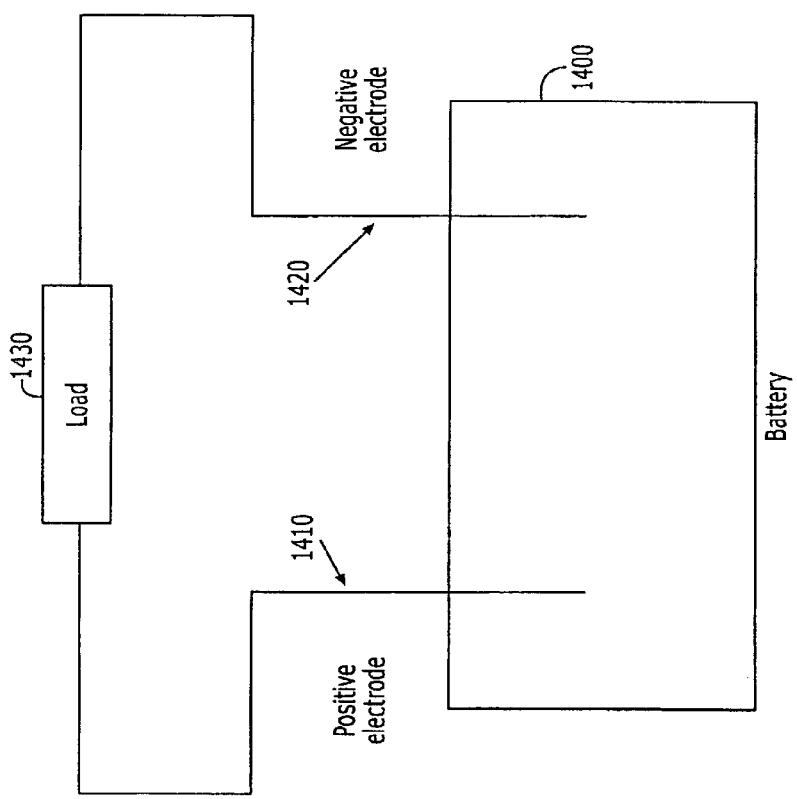
FIG. 14: illustrates a battery and load according to embodiments of the present invention.

A battery 1400 is shown in FIG. 14 with positive and negative electrodes 1410, 1420 and a load 1430. A measurement between the two electrodes 1410, 1420 may be made (cell voltage), or a measurement may be made from a single electrode, preferably the negative electrode 1420.

TABLE 1

Original, post thermal ageing and post water replenished capacities.

| Cell (periods of ageing) | Original | Post-age | Water replenished |
|---|---|---|---|
| | Capacity (% of rated capacity) | | |
| 0 periods #1 | 104 | 121 | 120 |
| 0 periods #2 | 103 | 123 | 120 |
| 2 periods #1 | 105 | 102 | 116 |
| 2 periods #2 | 106 | 109 | 119 |
| 3 periods #1 | 105 | 64 | 118 |
| 3 periods #2 | 105 | 64 | 111 |
| 4 periods #1 | 106 | 21 | 107 |
| 4 periods #2 | 105 | 10 | 97 |
| 5 periods #1 | 104 | 45 | 116 |
| 5 periods #2 | 104 | 30 | 106 |

TABLE 2

Cell pre- and post-age weights and weight differences.

| Cell (periods of ageing) | Pre-age weight | Post-age weight | Weight difference |
|---|---|---|---|
| | | (grams) | |
| 0 periods #1 | 18688 | 18689.5 | −1.5 |
| 0 periods #2 | 18614.5 | 18616.5 | −2 |
| 2 periods #1 | 18794 | 18646.5 | 147.5 |
| 2 periods #2 | 18848.5 | 18687.5 | 161 |
| 3 periods #1 | 18881 | 18644 | 237 |
| 3 periods #2 | 18806 | 18577.5 | 228.5 |
| 4 periods #1 | 18844.5 | 18554 | 290.5 |
| 4 periods #2 | 18838 | 18544.5 | 293.5 |
| 5 periods #1 | 18747.5 | 18554.5 | 193 |
| 5 periods #2 | 18677.5 | 18501 | 176.5 |

What is claimed is:

1. A method of obtaining information relating to the charge capacity of one or more cells including:
   measuring a variable cell parameter, or change in the variable cell parameter, for at least part of a Coup de Fouet discharge period during which the cell(s) voltage initially decreases to a trough voltage and then increases to a plateau voltage; and
   relating the variable cell parameter, or change in the variable cell parameter, to reference information to obtain the absolute or relative charge capacity of the cell or cells.

2. A method as claimed in claim 1 wherein the variable cell parameter is measured with respect to a single electrode.

3. A method as claimed in claim 1 wherein measurements are made of cell or electrode voltage, or change of voltage, for at least part of the Coup de Fouet discharge period during which the cell voltage initially decreases to the trough voltage and then increases to the plateau voltage.

4. A method as claimed in claim 1 wherein the reference information is a relationship between one or more cell operating conditions and the level of the trough voltage or plateau voltage.

5. A method as claimed in claim 4 wherein the operating conditions are one or more selected from the set consisting of time on charge depth of previous charge, float voltage, ambient temperature and discharge rate.

6. A method as claimed in claim 1 wherein prior to the initial period of discharge the one or more cells are in a substantially fully charged condition.

7. A method as claimed in claim 1 further including discrimination means which compares a change of a measured or monitored parameter with a change which is compatible with that which occurs in a Coup De Fouet period of initial discharge period and responds to whether or not that compatibility is present.

8. A method as claimed in claim 1 wherein the step of measuring the variable cell parameter occurs when the cell is subjected to a Coup de Fouet discharge period or when the battery begins to discharge when required to supply a load.

9. A method as claimed in claim 1 wherein the one or more cells is a battery.

10. A method as claimed in claim 9 wherein the battery is a lead/acid type battery or other battery which is rechargeable.

11. A method of estimating the capacity of a battery including:
   acquiring reference information relating a variable battery parameter, or change in a variable battery parameter, to one or more battery operating conditions or battery condition;
   measuring the variable battery parameter, or change in the variable battery parameter, during at least part of a Coup de Fouet discharge period of the battery during which the voltage initially decreases to a trough voltage and then increases to a plateau voltage; and relating the variable battery parameter, or change in variable battery parameter, to reference information to obtain the absolute or relative charge capacity of the battery.

12. A method as claimed in claim 11 wherein measurements are made of voltage, or change of voltage, for at least part of the period of time during which the battery voltage initially decreases to the trough voltage and then increases to the plateau voltage.

13. A method as claimed in claim 11 wherein the reference information is the relationship between one or more battery operating conditions or battery condition and the trough voltage or plateau voltage.

14. A method as claimed in claim 13 wherein the operating conditions are one or more selected from the set consisting of time on charge, depth of previous charge, float voltage, ambient temperature, and discharge rate.

15. A method as claimed in claim 11 wherein the step of measuring the variable battery parameter occurs when the battery is subjected to an initial period of discharge or when the battery begins to discharge when required to supply a load.

16. A method as claimed in claim 11 wherein prior to the initial period of discharge the battery is in a substantially fully charged condition.

17. A method as claimed in claim 11 including a further step of calculating the discharge time remaining.

18. A method as claimed in claim 11 including a further step of calculating a remaining operational life of the battery.

19. A method as claimed in claim 11 further including discrimination means which compares a change of a measured or monitored variable parameter with a change which is compatible with that which occurs in a Coup De Fouet discharge period and responds to whether or not that compatibility is present.

20. A method as claimed in claim 11 wherein the function of one or more of the steps is performed by a computer.

21. A method as claimed in claim 11 wherein the battery is a lead/acid type battery or other battery which is rechargeable.

22. An estimation model for predicting the absolute or relative capacity of a battery, including:
   input for a variable battery parameter, and one or more battery operating conditions or battery condition, measured during at least part of a Coup de Fouet discharge period during which the battery output voltage initially decreases to a trough voltage and then increases to a plateau voltage;
   reference information relating the variable battery parameter to one or more battery operating conditions or battery condition;
   compensation means determining a correction factor for the variable battery parameter depending on the value of any one of battery operating conditions or battery condition; and
   calculation means relating corrected variable battery parameter to the reference information to obtain the absolute or relative charge capacity of the battery.

23. An estimation model as claimed in claim 22 wherein the variable battery parameter is battery voltage, or change of battery voltage.

24. An estimation model as claimed in claim 22 including training or learning means adapted to determine reference information relating a variable battery parameter to one or more battery operating conditions or battery condition.

25. An estimation model as claimed in claim 22 including training or learning means adapted to determine rules relating the variable battery parameter, or change in variable battery parameter, to one or more battery operating conditions or battery condition.

26. An estimation model as claimed in claim 24 wherein said training or learning means is an Adaptive Neural Fuzzy Interface System or Adaptive Network, or other Neuro-Fuzzy or Soft Computing system.

27. An estimation model as claimed in claim 22 wherein the battery operating conditions are one or more selected from the set consisting of time on charge, depth of previous charge, float voltage, ambient temperature, and discharge rate.

28. An estimation model as claimed in claim 22 which is in the form of computer readable code.

29. An apparatus adapted to provide information relating to the charge capacity of a battery, including:
   measurement means adapted to measure a variable battery parameter, or change in variable battery parameter during at least part of a Coup de Fouet discharge period during which the battery voltage initially decreases to a trough voltage and then increases to a plateau voltage; and
   processing means adapted to relate the variable battery parameter, or change in variable battery parameter, to referenced information to obtain the absolute or relative charge capacity of the battery.

30. An apparatus as claimed in claim 29 further including discrimination means which compares a change of the measured variable battery parameter with a change which is compatible with that which occurs in a Coup De Fouet period of initial discharge of the battery and response to whether or not compatibility is present.

31. An apparatus as claimed in claim 29 further adapted to measure one or more battery operating conditions.

32. An apparatus as claimed in claim 31 wherein the operating conditions are one or more selected from the set of time on charge, depth of previous charge, float voltage, ambient temperature, and discharge rate.

33. An apparatus as claimed in claim 29 which includes a microprocessor adapted to manipulate a variable battery parameter, or change in variable battery parameter, and one or more battery operating conditions or battery condition and predict the absolute or relative charge capacity of the battery.

34. An apparatus as claimed in claim 33 wherein the microprocessor is adapted to output the discharge time remaining expressed in hours and fractions of an hour, or is adapted to output the remaining operational life of the battery.

35. An apparatus as claimed in claim 29 which further includes a load, the load adapted to at least partially discharge the battery.

36. An apparatus as claimed in claim 29 which further includes training or learning means adapted to determine rules relating a variable battery parameter, or change in a variable battery parameter, to one or more battery operating conditions and/or battery condition.

37. An apparatus as claimed in claim 36 wherein the training or learning means is an Adaptive Neural Fuzzy Interface System or Adaptive Network, or other Neuro-Fuzzy or Soft Computing System.

38. An apparatus as claimed in claim 29 which includes an output means adapted to graphically, numerically or otherwise indicate, in real time, the charge capacity, discharge time remaining or remaining operational life of a battery.

39. An estimation model as claimed in claim 25 wherein said training or learning means is an Adaptive Neural Fuzzy Interface System or Adaptive Network, or other Neuro-Fuzzy of Soft Computing system.

40. A method as claimed in claim 2 wherein the single electrode is the negative electrode.

41. A method of estimating capacity of an electrochemical energy storage cell, the method comprising:
obtaining a Coup de Fouet parameter value for the cell; and
estimating a charge capacity of the cell from the Coup de Fouet parameter value.

42. A method according to claim 41:
wherein obtaining a Coup de Fouet parameter value comprises obtaining a voltage value for the cell for a Coup de Fouet discharge period; and
wherein estimating a charge capacity of the cell comprises estimating the charge capacity of the cell from the voltage value.

43. A method according to claim 41:
wherein obtaining a voltage value comprises obtaining a trough voltage value for the Coup de Fouet discharge period; and
wherein estimating a charge capacity comprises estimating the charge capacity from the trough voltage value.

44. A method according to claim 43, wherein estimating the charge capacity from the trough voltage value comprises:
correcting the trough voltage value based on an at least one of an operating condition and a cell condition of the cell; and
estimating the charge capacity from the corrected trough voltage value.

45. A method according to claim 44, wherein the at least one of an operating condition and a cell condition comprises at least one of time on charge, depth of previous charge, float voltage, discharge rate, and temperature.

46. A method according to claim 44, wherein correcting the trough voltage value comprises correcting the trough voltage value based on the at least one of an operating condition and a cell condition using a fuzzy logic model.

47. A method according to claim 41, wherein estimating a charge capacity comprises:
correcting the Coup de Fouet parameter value based on an at least one of an operating condition and a cell condition of the cell; and
estimating the charge capacity from the corrected Coup de Fouet parameter value.

48. A method according to claim 47, wherein the at least one of an operating condition and a cell condition comprises at least one of time on charge, depth of previous charge, float voltage, discharge rate, and temperature.

49. A method according to claim 47, wherein correcting the Coup de Fouet parameter value comprises correcting the Coup de Fouet parameter value based on the at least one of an operating condition and a cell condition using a fuzzy logic model.

50. An apparatus for estimating capacity of an electrochemical energy storage cell, comprising:
a computer configured to estimate a charge capacity of the cell from a Coup de Fouet parameter value.

51. An apparatus according to claim 41, wherein the Coup de Fouet parameter value comprises a voltage value for a Coup de Fouet discharge period.

52. An apparatus according to claim 41, wherein the voltage value comprises a trough voltage value for the Coup de Fouet discharge period.

53. An apparatus according to claim 43, wherein the computer is further configured to correct the trough voltage value based on an at least one of an operating condition and a cell condition of the cell and to estimate the charge capacity from the corrected trough voltage value.

54. An apparatus according to claim 53, wherein the at least one of an operating condition and a cell condition comprises at least one of time on charge, depth of previous charge, float voltage, discharge rate, and temperature.

55. An apparatus according to claim 53, wherein the computer is configured to implement a fuzzy logic model operative to correct the trough voltage value based on the at least one of an operating condition and a cell condition.

56. An apparatus according to claim 50, wherein the computer is configured to correct the Coup de Fouet parameter value based on an at least one of an operating condition and a cell condition of the cell and to estimate the charge capacity from the corrected Coup de Fouet parameter value.

57. An apparatus according to claim 56, wherein the at least one of an operating condition and a cell condition comprises at least one of time on charge, depth of previous charge, float voltage, discharge rate, and temperature.

58. An apparatus according to claim 56, wherein the computer is configured to implement a fuzzy logic model operative to correct the Coup de Fouet parameter value based on the at least one of an operating condition and a cell condition.

59. A computer program product comprises computer readable code embodied in a computer-readable storage medium, the computer readable code comprising:
code configured to estimate a charge capacity of the cell from the Coup de Fouet parameter value.

60. A computer program product according to claim 59, wherein the code configured to estimate a charge capacity comprises code configured to estimate the charge capacity of the cell from a voltage value for the cell for a Coup de Fouet discharge period.

61. A computer program product according to claim 59, wherein the code configured to estimate a charge capacity comprises code configured to estimate the charge capacity of the cell from a trough voltage value for the cell for a Coup de Fouet discharge period.

62. A computer program product according to claim 59, wherein the code configured to estimate a charge capacity comprises code configured to correct the Coup de Fouet parameter value based on an at least one of an operating condition and a cell condition of the cell and to estimate the charge capacity from the corrected Coup de Fouet parameter value.

63. A computer program product according to claim 62, wherein the at least one of an operating condition and a cell condition comprises at least one of time on charge, depth of previous charge, float voltage, discharge rate, and temperature.

64. A computer program product according to claim 62, wherein the code configured to correct the Coup de Fouet parameter value based on an at least one of an operating condition and a cell condition of the cell and to estimate the charge capacity from the corrected Coup de Fouet parameter value comprises code configured to implement a fuzzy logic model operative to correct the Coup de Fouet parameter value based on the at least one of an operating condition and a cell condition.

* * * * *

UNITED STATES PATENT AND TRADEMARK OFFICE
CERTIFICATE OF CORRECTION

PATENT NO. : 6,924,622 B1
APPLICATION NO. : 09/979906
DATED : August 2, 2005
INVENTOR(S) : Anbuky et al.

It is certified that error appears in the above-identified patent and that said Letters Patent is hereby corrected as shown below:

On the title page

Item (30) Foreign Application Priority Data     change "Jun. 3, 1999   (GB)" to
-- Jun. 3, 1999   (NZ) --.

Column 1, line 8     change "claiming priority to New Zealand Application" to
-- claiming priority to Great Britain Application --.

Signed and Sealed this

Nineteenth Day of February, 2008

JON W. DUDAS
*Director of the United States Patent and Trademark Office*

UNITED STATES PATENT AND TRADEMARK OFFICE
CERTIFICATE OF CORRECTION

PATENT NO. : 6,924,622 B1  Page 1 of 1
APPLICATION NO. : 09/979906
DATED : August 2, 2005
INVENTOR(S) : Anbuky et al.

It is certified that error appears in the above-identified patent and that said Letters Patent is hereby corrected as shown below:

On Title Page:
Item (30): Foreign Application Priority Data change "Jun. 3, 1999    (NZ)" to
-- Jun. 3, 1999    (GB) --

Signed and Sealed this

Twenty-eighth Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 6,924,622 B1  Page 1 of 1
APPLICATION NO. : 09/979906
DATED : August 2, 2005
INVENTOR(S) : Anbuky et al.

It is certified that error appears in the above-identified patent and that said Letters Patent is hereby corrected as shown below:

On Title Page:
Item (30): Foreign Application Priority Data change "Jun. 3, 1999 (NZ)" to -- Jun. 3, 1999 (GB) --

Signed and Sealed this

Eighteenth Day of August, 2009

David J. Kappos
*Director of the United States Patent and Trademark Office*

UNITED STATES PATENT AND TRADEMARK OFFICE
CERTIFICATE OF CORRECTION

PATENT NO. : 6,924,622 B1
APPLICATION NO. : 09/979906
DATED : August 2, 2005
INVENTOR(S) : Adnan H. Anbuky et al.

It is certified that error appears in the above-identified patent and that said Letters Patent is hereby corrected as shown below:

This certificate vacates the Certificate of Correction issued August 18, 2009. The certificate is a duplicate of the Certificate of Correction issued July 28, 2009. All requested changes were included in the Certificate of Correction issued July 28, 2009.

Signed and Sealed this

Fifteenth Day of September, 2009

David J. Kappos
*Director of the United States Patent and Trademark Office*